US012620979B1

(12) United States Patent
Wang et al.

(10) Patent No.: US 12,620,979 B1
(45) Date of Patent: May 5, 2026

(54) PROGRAMMABLE DIGITAL OSCILLATOR

(71) Applicant: Regents of the University of Minnesota, Minneapolis, MN (US)

(72) Inventors: Zhiheng Wang, San Diego, CA (US); Seyednaser Mousavi, Eden Prairie, MN (US); Ramesh Harjani, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 2014 days.

(21) Appl. No.: 16/602,810

(22) Filed: Aug. 30, 2019

Related U.S. Application Data

(60) Provisional application No. 62/725,924, filed on Aug. 31, 2018.

(51) Int. Cl.
H03K 3/02 (2006.01)
H03M 1/66 (2006.01)

(52) U.S. Cl.
CPC .............. H03K 3/02 (2013.01); H03M 1/66 (2013.01)

(58) Field of Classification Search
CPC .................................. H03K 3/02; H02M 1/66
See application file for complete search history.

(56) References Cited

U.S. PATENT DOCUMENTS 3,649,821 A * 3/1972 Gumacos ................ H04L 27/26
327/107
4,839,842 A * 6/1989 Pyi ........................ H04Q 1/4575
708/276

5,198,779 A * 3/1993 Bruton .................... G06F 17/10
327/357
5,412,588 A * 5/1995 Shiraishi ................. G06F 7/548
708/276
5,701,393 A * 12/1997 Smith, III .............. G10H 5/007
704/258
6,526,101 B1 * 2/2003 Patel ........................ H03D 1/24
375/240.28
9,948,315 B2 * 4/2018 Dempsey ............ H03M 1/0881
10,972,123 B1 * 4/2021 Hughes ................. H03M 3/368
2005/0013386 A1 1/2005 Ojard

OTHER PUBLICATIONS

Cabric et al., "Wireless Field Trial Results of a High Hopping Rate FHSS-FSK Testbed," IEEE Journal on Selected Areas in Communications, vol. 23, No. 5, May 2005, 10 pp.

(Continued)

*Primary Examiner* — Menatoallah Youssef
*Assistant Examiner* — Khareem E Almo
(74) *Attorney, Agent, or Firm* — Shumaker & Sieffert, P.A.

(57) ABSTRACT

An example programmable digital oscillator includes digital oscillation circuitry and a digital-to-analog converter (DAC). The digital oscillation circuitry includes exactly one digital multiplier, exactly one digital adder, and exactly two registers. The digital oscillation circuitry is configured to provide digital oscillation signals at one or more frequencies as a function of a programmable code, where the programmable code is provided as input to the exactly one digital multiplier. The DAC is communicatively coupled to the digital oscillation circuitry and is configured to convert the digital oscillation signals from the digital oscillation circuitry into analog oscillation signals.

22 Claims, 18 Drawing Sheets

(56) References Cited

OTHER PUBLICATIONS

Zhang et al., "An Integrated CMOS Passive Self-Interference Mitigation Technique for FDD Radios," IEEE Journal of Solid-State Circuits, vol. 50, No. 5, May 2015, 13 pp.

Ghaffari et al., "Tunable High-Q N-Path Band-Pass Filters: Modeling and Verification," IEEE Journal of Solid-State Circuits, vol. 46, No. 5, May 2011, 13 pp.

Lu et al., "A High-Quality Analog Oscillator Using Oversampling D/A Conversion Techniques," IEEE Transactions on Circuits and Systems—II: Analog and Digital Signal Processing, vol. 41, No. 7, Jul. 1994, 8 pp.

Al-Shammary et al., "Code Selective Filters in CMOS Processes for Full Duplex Communication and Interference Mitigation," GMOACTech, Mar. 2018, 5 pp.

Hancock, "Signal Processing at RF (SPAR)," DARPA, Defense Advanced Research Projects Agency, accessed from https://www.darpa.mil/program/signal-processing-at-rf, accessed on Mar. 26, 2020, 1 pp.

"MAAP-010168," MACOM Technology Solutions, Inc., accessed from https://cdn.macom.com/datasheets/MAAP-010168.pdf, accessed on Mar. 26, 2020, 9 pp.

Geng et al., "An 11-Bit 8.6 GHz Direct Digital Synthesizer MMIC With 10-Bit Segmented Sine-Weighted DAC," IEEE Journal of Solid-State Circuits, vol. 45, No. 2, Feb. 2010, 14 pp.

Razavi, "A Study of Phase Noise in CMOS Oscillators," IEEE Journal of Solid-State Circuits, vol. 31, No. 3, Mar. 1996, 13 pp.

Cho et al., "A 60 kb/s-10 Mb/s Adaptive Frequency Hopping Transceiver for Interference-Resilient Body Channel Communication," IEEE Journal of Solid-State Circuits, vol. 44, No. 3, Mar. 2009, 10 pp.

Peng et al., "High-Performance Frequency-Hopping Transmitters Using Two-Point Delta-Sigma Modulation," IEEE Transactions on Microwave Theory and Techniques, vol. 52, No. 11, Nov. 2004, 7 pp.

Mousavi et al., "A 0.4-1.0 GHZ, 47 MHop/s Frequency-Hopped TXR Front End With 20 dB In-Band Blocker Rejection," IEEE Journal of Solid-State Circuits, May 22, 2019, 12 pp.

Harjani et al., "An Ultra-Fast Hopping Correlator-Based Transceiver with In-Band Jammer Resistance and Multi-Path Resilience," Proceedings of GOMAC, Mar. 12-15, 2018, 4 pp.

Kalia et al., "A Simple, Unified Phase Noise Model for Injection-Locked Oscillators," IEEE Radio Frequency Integrated Circuits Symposium, Jun. 2011, 4 pp.

Harjani et al., "Ultra-Fast Frequency Hopped Transceivers," ICECS Bordeaux, University of Minnesota, Dec. 2018, 29 pp.

Harjani et al., "System Tradeoffs in Ultra-Fast Frequency Hopped Tranceivers," GOMACTech, Mar. 27, 2019, 31 pp.

Harjani et al., "System Tradeoffs in Ultra-Fast Frequency Hopped Transceivers," GOMACTech, Mar. 25, 2019, 4 pp.

Harjani et al., "An Ultra-Fast Hopping Correlator-Based Transceiver with In-Band Jammer Resistance and Multi-Path Resilience," GOMACTech-2018, Mar. 14, 2018, 37 pp.

Mousavi et al., "A 0.4-1.0GHZ, 47MHop/S Frequency Hopped TXR Front-End With 20dB In-Band Blocker Rejection," Institute of Electrical and Electronic Engineers (IEEE) 44th European Solid State Circuits Conference (ESSCIRC 2018), Dresden, Germany, Sep. 3-5, 2018.

Razavi et al., "Inter-N and Fractional-N Synthesizers," Electrical Engineering Department of the University of California, Los Angeles, Oct. 2014, 26 pp.

Lanka et al., "Frequency-Hopped Quadrature Frequency Synthesizer in 0.13-um Technology," IEEE Journal of Solid-State Circuits, vol. 46, No. 9, Sep. 2011, 12 pp.

Yang et al., "Multiferroic Thin Film Circulator with Unable Bandpass Behavior," USNC-URSI Radio Science Meeting (Joint with AP-S Symposium), Jul. 2014.

Omer et al., "A PA-Noise Cancellation Technique for Next Generation Highly Integrated RF Front-Ends," IEEE Radio Frequency Integrated Circuits Symposium, Jun. 2012, 4 pp.

Van de Sande et al., "A 7.2 GSa/s, 14 Bit or 12 GSa/s, 12 Bit Signal Generator on a Chip in a 165 GHz fT BiCMOS Process," IEEE Journal of Solid-State Circuits, vol. 47, No. 4, Apr. 2012, 10 pp.

Min et al., "An All-CMOS Architecture for a Low-Power Frequency-Hopped 900 MHz Spread Spectrum Transceiver," IEEE 1994 Custom Integrated Circuits Conference, 4 pp.

Agrawal et al., "A 0.3 GHZ to 1.4 GHz N-path Mixer-based Code-Domain RX with TX Self-Interference Rejection," 2017 IEEE Radio Frequency Integrated Circuits Symposium, Jun. 2017, 4 pp.

Hill et al., "A 30.9 dBm, 300 MHz 45-nm SOI CMOS Power Modulator for Spread-Spectrum Signal Processing at the Antenna," 2018 IEEE/MTT-S International Microwave Symposium, Jun. 2018, 4 pp.

Agrawal et al., "An Interferer-Tolerant CMOS Code-Domain Receiver Based on N-Path Filters," IEEE Journal of Solid-State Circuits, vol. 53, No. 5, May 2018, 11 pp.

Ghaffari et al., "8-Path Tunable RF Notch Filters for Blocker Suppression," Proc. IEEE International Solid-State Circuits Conference, Feb. 2012, 3 pp.

Kargaran et al., "Low Power Wideband Receiver with RF Self-Interference Cancellation for Full-Duplex and FDD Wireless Diversity," 2017 IEEE Radio Frequency Integrated Circuits Symposium (RFIC), Jun. 2017, 4 pp.

Yeoh et al., "A 1.3-GHz 350-mW Hybrid Direct Digital Frequency Synthesizer in 90-nm CMOS," IEEE Journal of Solid-State Circuits, vol. 45, No. 9, Sep. 2010, 11 pp.

Zhou et al., "A 12-Bit Nonlinear DAC for Direct Digital Frequency Synthesis," IEEE Transactions on Circuits and Systems—I: Regular Papers, vol. 55, No. 9, Oct. 2008, 10 pp.

Geng et al., "24-Bit 5.0 GHz Direct Digital Synthesizer RFIC With Direct Digital Modulations in 0.13 um SiGe BiCMOS Technology," IEEE Journal of Solid-State Circuits, vol. 45, No. 5, May 2010, 11 pp.

Yu et al., "A 12 GHz 1.9 W Direct Digital Synthesizer MMIC Implemented in 0.18 um SiGe BICMOS Technology," IEEE Journal of Solid-State Circuits, vol. 43, No. 6, Jun. 2008, 10 pp.

Nosaka et al., "A Low-Power Direct Digital Synthesizer Using a Self-Adjusting Phase-Interpolation Technique," IEEE Journal of Solid-State Circuits, vol. 36, No. 8, Aug. 2001, 5 pp.

Song et al., "A 14-b Direct Digital Frequency Synthesizer With Sigma-Delta Noise Shaping," IEEE Journal of Solid-State Circuits, vol. 39, No. 5, May 2004, 5 pp.

Dai et al., "A Direct Digital Frequency Synthesizer With Fourth-Order Phase Domain Noise Shaper and 12-bit Current-Steering DAC," IEEE Journal of Solid-State Circuits, vol. 41, No. 4, Apr. 2006, 12 pp.

De Caro et al., "A 380 MHz Direct Digital Synthesizer/Mixer With Hybrid CORDIC Architecture in 0.25 um CMOS," IEEE Journal of Solid-State Circuits, vol. 42, No. 1, Jan. 2007, 10 pp.

Tan et al., "An 800-MHz Quadrature Digital Synthesizer with ECL-Compatible Output Drivers in 0.8 um CMOS," IEEE Journal of Solid-State Circuits, vol. 30, No. 12, Dec. 1995, 3 pp.

Yoo et al., "A 2 GHz 130 mW Direct-Digital Frequency Synthesizer With a Nonlinear DAC in 55 nm CMOS," IEEE Journal of Solid-State Circuits, vol. 49, No. 12, Dec. 2014, 14 pp.

Alonso et al., "A 7GS/s Direct Digital Frequency Synthesizer with a Two-Times Interleaved RDAC in 65nm CMOS," Proc. 43rd IEEE European Solid State Circuits Conference, Sep. 2017, 4 pp.

Yang et al., "Optimized Design of N-Phase Passive Mixer-First Receivers in Wideband Operation," IEEE Transactions on Circuits and Systems—I: Regular Papers, vol. 62, No. 11, Nov. 2015, 12 pp.

Lien et al., "A High-Linearity CMOS Receiver Achieving +44dBm IIP3 and +13dBm B1dB for SAW-Less LTE Radio," IEEE Int. Solid-State Circuits Conference (ISSCC) Digital Technology Papers, Feb. 2017, 3 pp.

AlShammary et al., "A λ/4-Inverted N-path Filter in 45-nm CMOS SOI for Transmit Rejection with Code Selective Filters," IEEE/MTT-S International Microwave Symposium, Jun. 2018, 4 pp.

Lanka et al., "Understanding the Transient Behavior of Injection Locked LC Oscillators," IEEE 2007 Custom Integrated Circuits Conference (CICC), Sep. 207, 4 pp.

(56) References Cited

OTHER PUBLICATIONS

Felstead, "Follower Jammer Considerations for Frequency Hopped Spread Spectrum," IEEE Communications Conference, Applicant points out, in accordance with MPEP 609.04(a), that the year of publication, 1988, is sufficiently earlier than the effective U.S. filing date, so that the particular month of publication is not in issue, 5 pp. U.S. Appl. No. 16/602,808, by Regents of the University of Minnesota (Inventors: Harjani et al.), filed Aug. 30, 2019.

* cited by examiner

404A

Current based

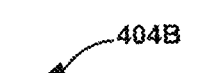
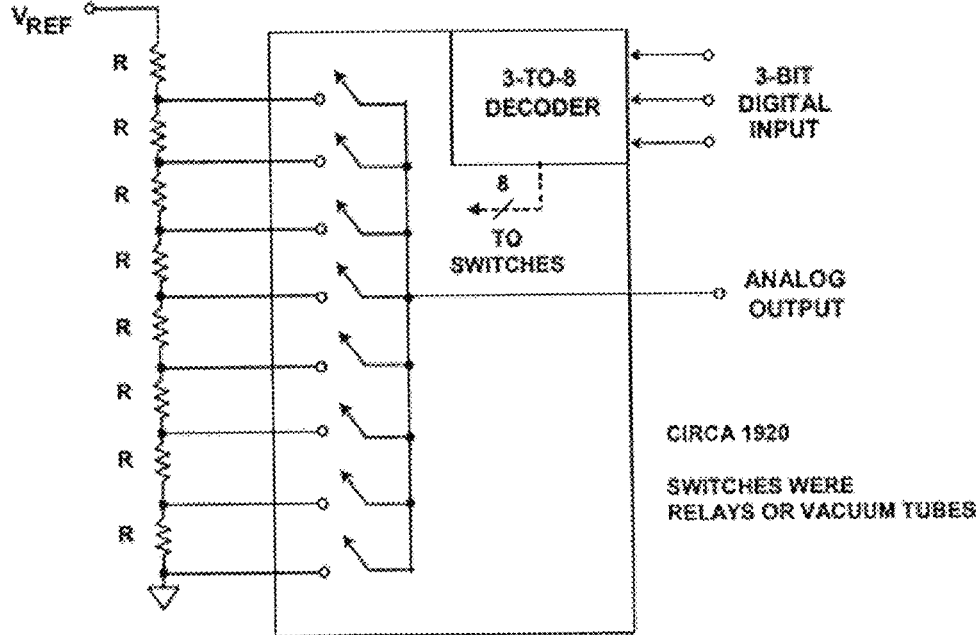
Resistor based
FIG. 4B

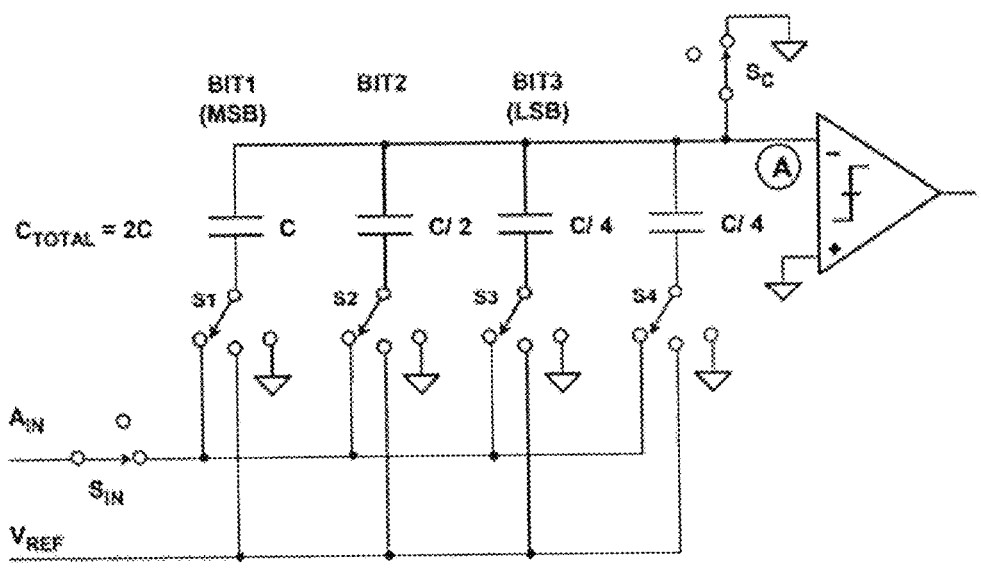
Capacitor based
FIG. 4C

520

$V_{out}$ $Z_P$   $Z_N$   $Z_N$   $Z_P$ $V_{in}$

R    2R    4R    8R    16R

C    2C    4C    8C    16C

508/514

$S_{12}$   $S_{22}$   $S_{32}$   $S_{42}$

+I   +Q   -I   -Q $C_1$   $C_2$   $C_3$   $C_4$ $S_{11}$   $S_{21}$   $S_{31}$   $S_{41}$ $V_{in}$ $V_{out}$ 25% Duty Cycle Divider CLK $f_1$ $f_2$ $f_1$

Digital Oscillator Transfer Function

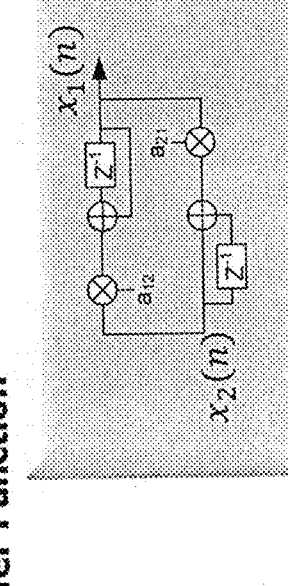
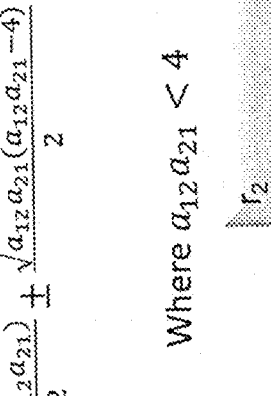
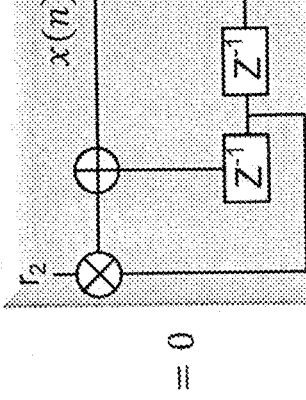
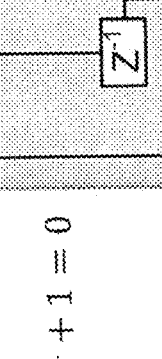
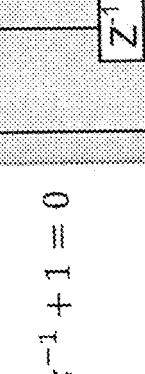

Original Form $$x_2(n) = x_2(n-1) - a_{21}x_1(n)$$
$$x_1(n) = x_1(n-1) + a_{12}x_2(n-1)$$

Simplified Form $$x_1(n-2) + (a_{12}a_{21} - 2)x_1(n-1) + x_1(n) = 0$$

$$z^{-2} + (a_{12}a_{21} - 2)z^{-1} + 1 = 0 \quad \Rightarrow \quad z_{1,2}^{-1} = \frac{(2-a_{12}a_{21})}{2} \pm \frac{\sqrt{a_{12}a_{21}(a_{12}a_{21}-4)}}{2}$$

$$z_{12}^{-1} = e^{\pm j\cos^{-1}\left(\frac{2-a_{12}a_{21}}{2}\right)}$$

$$z^{-2} + (a_{12}a_{21} - 2)z^{-1} + 1 = 0 \quad \Rightarrow \quad z^{-2} + r_2 z^{-1} + 1 = 0$$

Where $a_{12}a_{21} < 4$

602

➜ Fewer computations, integrators → lower power & higher speed

FIG. 6

PROGRAMMABLE DIGITAL OSCILLATOR

This application claims the benefit of U.S. Provisional Application No. 62/725,924 filed Aug. 31, 2018, which is incorporated herein by reference in its entirety.

GOVERNMENT INTEREST

This invention was made with government support under HR0011-17-2-0001 awarded by the Defense Advanced Research Projects Agency (DARPA). The government has certain rights in the invention.

TECHNICAL FIELD

The present disclosure relates to oscillator circuitry and systems.

BACKGROUND

Various prior techniques have been implemented to generate custom signals, such as custom oscillation signals. For example, analog phase locked loop (PLL) (e.g., Integer N PLL's, fraction N PLL's) may be utilized to generate custom signals. In some cases, digital PLL's may also be utilized in generating these types of oscillation signals. Another popular approach in generating custom signals is via the use of direct digital synthesis (DDS).

SUMMARY

The present disclosure describes techniques for implementing a digital oscillator (e.g., digital sine-wave oscillator) that has lower circuit complexity, lower power consumption, and higher-speed operation. This digital oscillator may include a combination of only one multiplier and one integrator. In various examples, the output frequency of the digital oscillator may be programmable, and may, in some cases, be centered around, e.g., fs/4, where fs is the sampling clock frequency. In various non-limiting examples, the output frequency of the digital oscillator can go anywhere between 0 to fs/2, based on the programmable code. The output of the digital oscillator, may also be converted to an analog value using an on-chip digital-to-analog converter. The digital oscillator described herein may be used in various applications, such as radar applications and carrier aggregation applications.

In one example, a programmable digital oscillator includes digital oscillation circuitry and a digital-to-analog converter (DAC). The digital oscillation circuitry includes exactly one digital multiplier, exactly one digital adder, and exactly two registers. The digital oscillation circuitry is configured to provide digital oscillation signals at one or more frequencies as a function of a programmable code, where the programmable code is provided as input to the exactly one digital multiplier. The DAC is communicatively coupled to the digital oscillation circuitry and is configured to convert the digital oscillation signals from the digital oscillation circuitry into analog oscillation signals.

In one example, a method includes providing, by digital oscillation circuitry of a programmable digital oscillator, digital oscillation signals at one or more frequencies as a function of a programmable code, wherein the digital oscillation circuitry includes exactly one digital multiplier, exactly one digital adder, and exactly two registers, and wherein the programmable code is provided as input to the exactly one digital multiplier. The example method further includes converting, by a digital-to-analog converter (DAC) of the programmable digital oscillator that is communicatively coupled to the digital oscillation circuitry, the digital oscillation signals from the digital oscillation circuitry into analog oscillation signals.

In one example, a digital oscillator system includes a plurality of digital oscillators. Each digital oscillator of the plurality of digital oscillators includes: digital oscillation circuitry that includes exactly one digital multiplier, exactly one digital adder, and exactly two registers, wherein the digital oscillation circuitry is configured to provide digital oscillation signals at one or more frequencies as a function of a programmable code of the respective digital oscillator, and wherein the programmable code is provided as input to the exactly one digital multiplier; and a digital-to-analog converter (DAC) communicatively coupled to the digital oscillation circuitry, wherein the DAC is configured to convert the digital oscillation signals from the digital oscillation circuitry into analog oscillation signals. The digital oscillator system further includes coupling circuitry that is configured to communicatively couple the analog oscillation signals output by each digital oscillator of the plurality of digital oscillators with a respective data stream of a plurality of data streams, wherein each respective data stream is received or transmitted via wireless communication channels within a respective wireless channel range.

In one example, a method of carrier aggregation includes providing, by a first digital oscillator included in a plurality of digital oscillators, first analog oscillation signals, and providing, by a second digital oscillator included in the plurality of digital oscillators, second analog oscillation signals. Each of the first and second digital oscillators comprises: digital oscillation circuitry that includes exactly one digital multiplier, exactly one digital adder, and exactly two registers, wherein the digital oscillation circuitry is configured to provide respective digital oscillation signals at one or more frequencies as a function of a programmable code of the respective digital oscillator, and wherein the programmable code is provided as input to the exactly one digital multiplier; and a digital-to-analog converter (DAC) communicatively coupled to the digital oscillation circuitry, wherein the DAC is configured to convert the respective digital oscillation signals from the digital oscillation circuitry into respective analog oscillation signals. The example method further includes coupling, by coupling circuitry, the first analog oscillation signals with a first carrier data stream that is received or transmitted via wireless communication channels within a first wireless channel range, and coupling, by the coupling circuitry, the second analog oscillation signals with a second carrier data stream that is received or transmitted via wireless communication channels within a second wireless channel range that is different from the first wireless channel range, wherein the first and second carrier data streams are aggregated via one or more aggregated data pipes to provide an aggregated bandwidth for the first and second carrier data streams.

The details of one or more examples of the disclosure are set forth in the accompanying drawings and the description below. Other features, objects, and advantages of the disclosure will be apparent from the description and drawings, and from the claims.

3

FIGS. 2A-2D are diagrams illustrating examples of digital oscillators and current-steering digital-to-analog converters (DAC's), along with example phase and current steering information, in accordance with one or more aspects of the present disclosure.

Figure 2A:
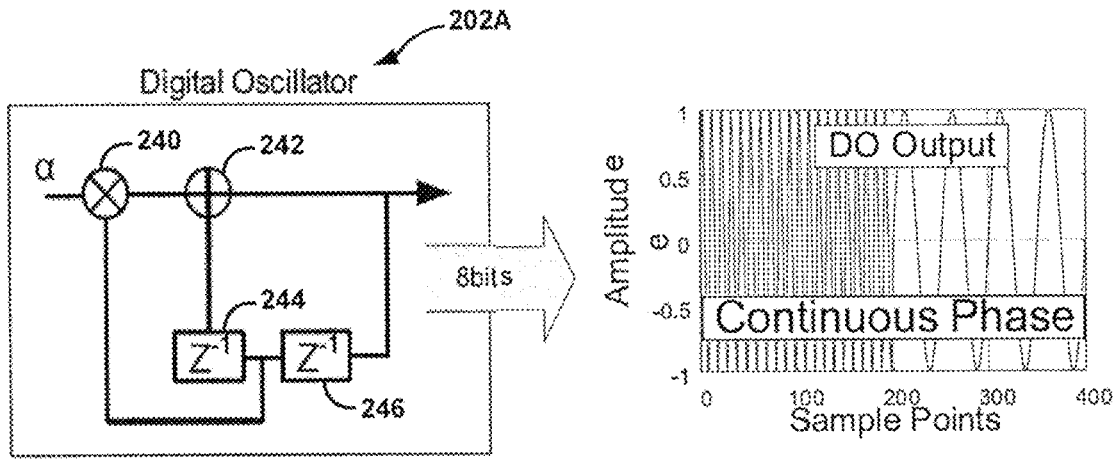
Figure 2B:
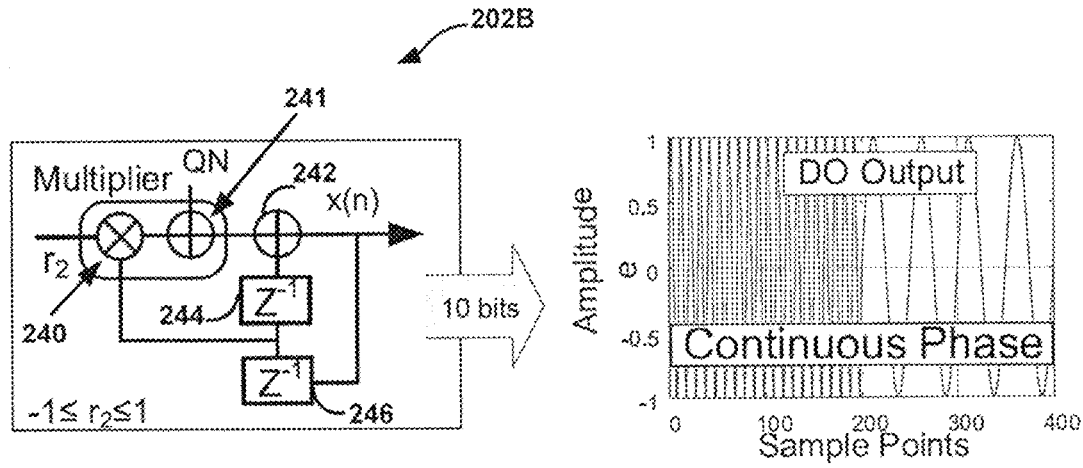
Figure 2C:
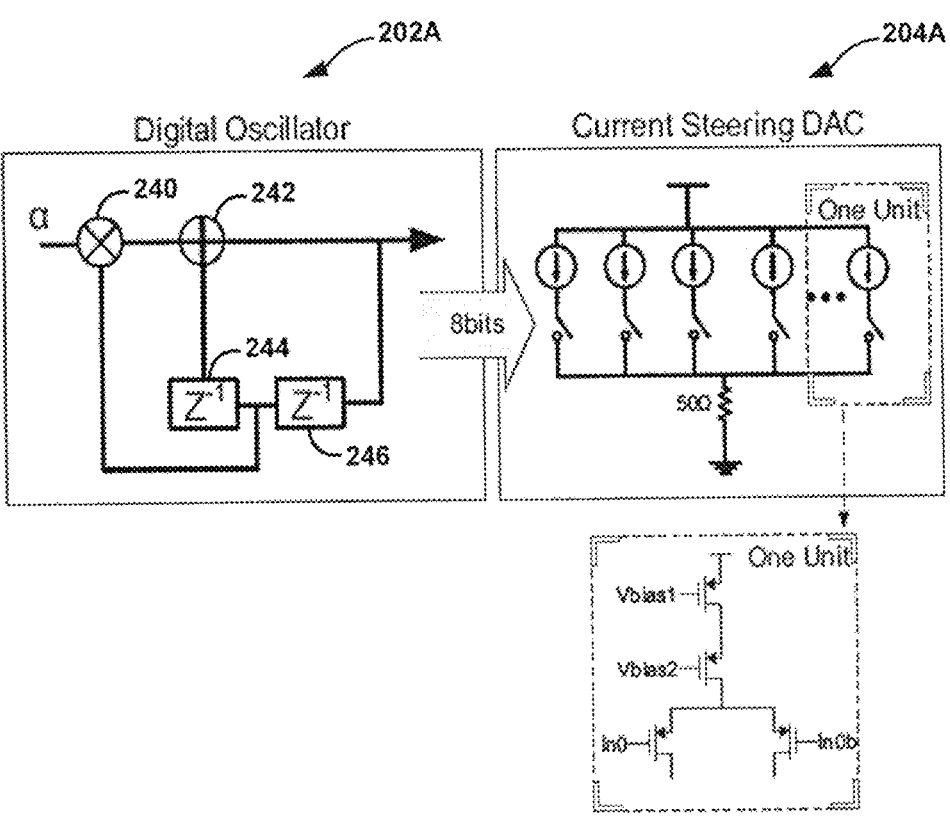
Figure 2D:
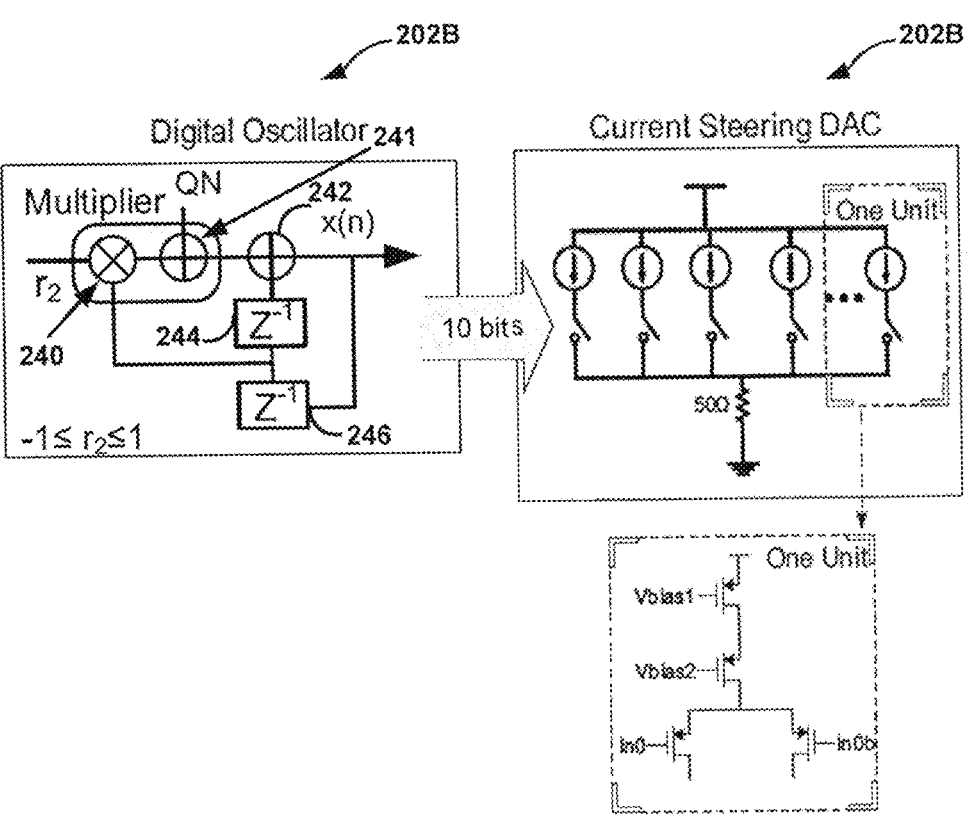
Figure 2E:
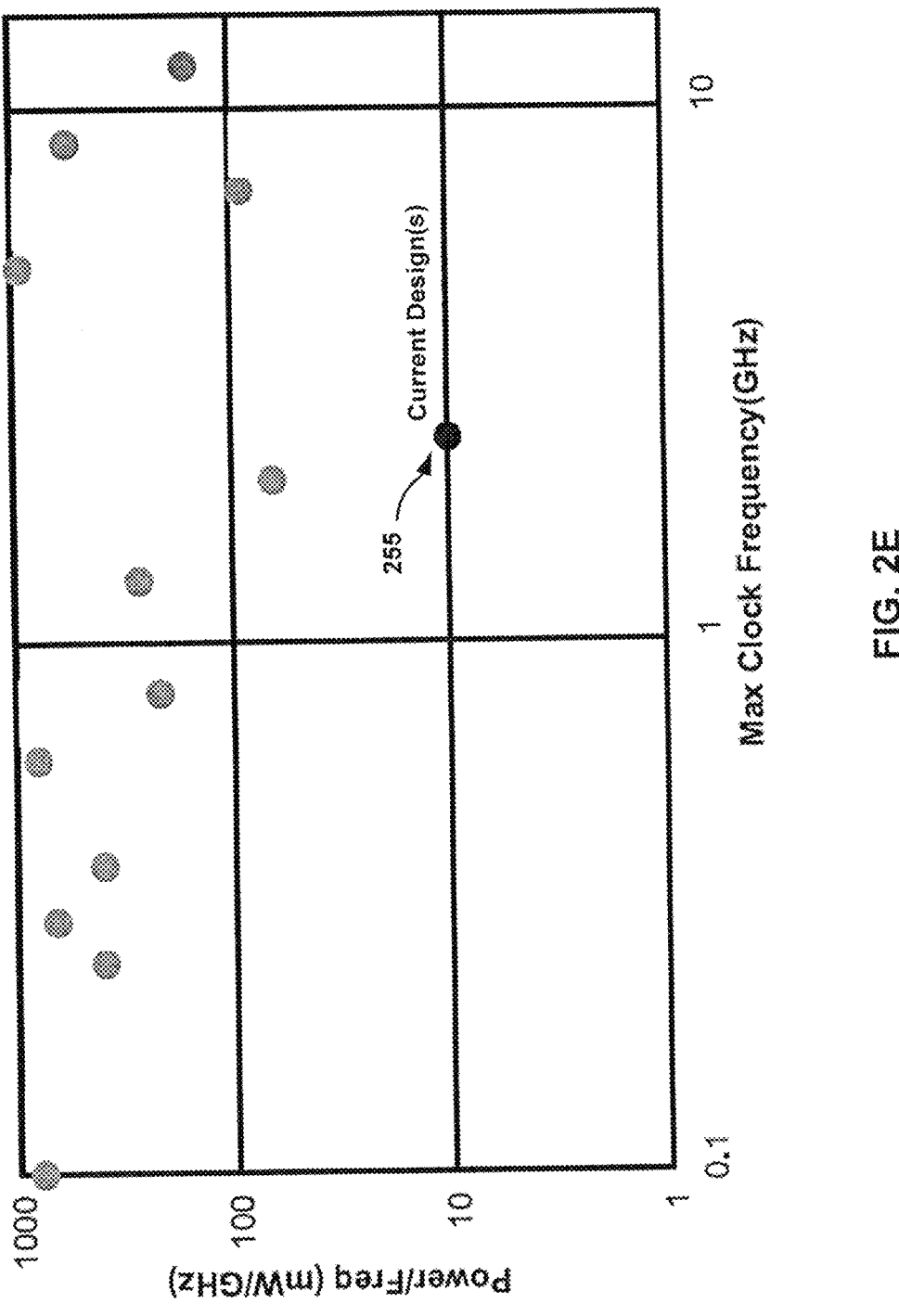

FIG. 2E is a graph illustrating power consumption and maximum clock frequency with respect to embodiments of the disclosed digital oscillator in comparison to designs of direct digital synthesis (DDS) circuits.

Figure 3A:
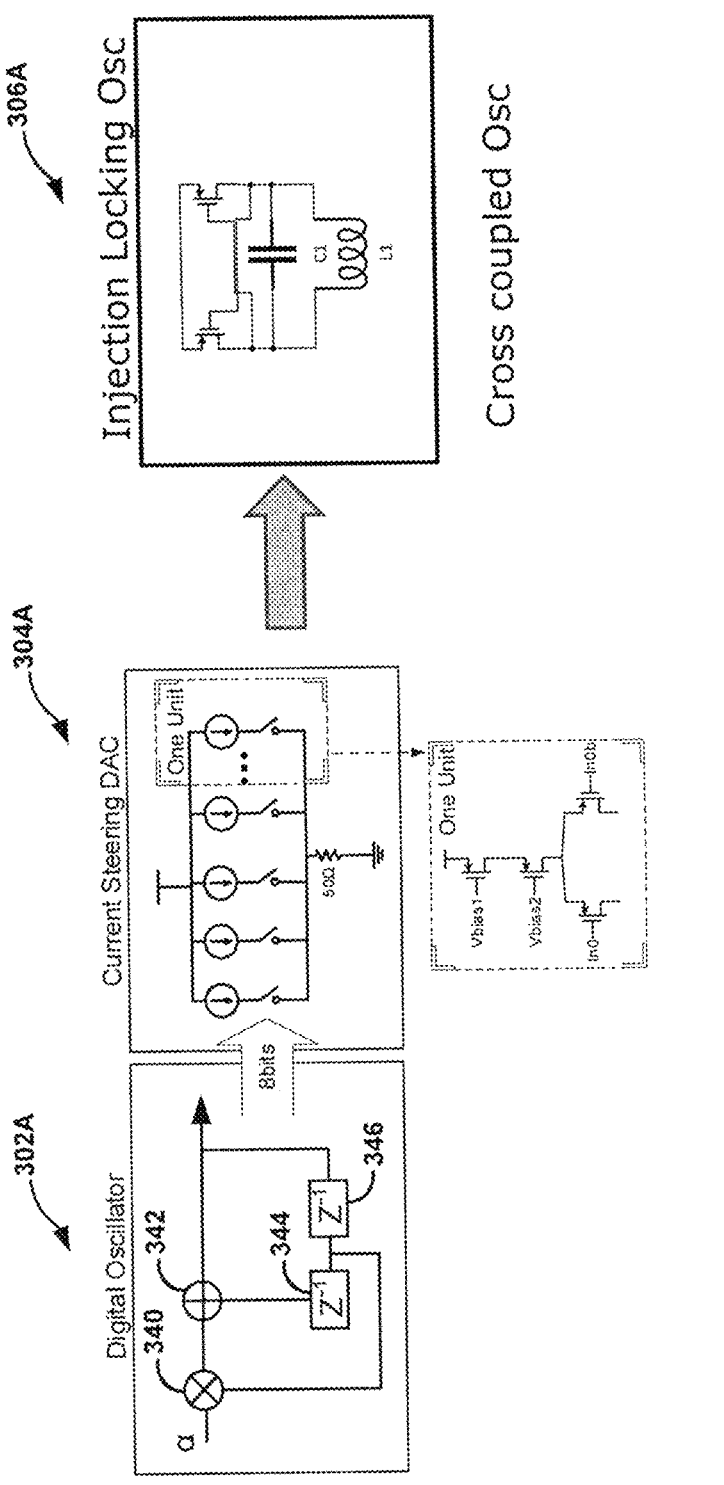

FIG. 3A is a diagram illustrating an example digital oscillator that includes or is otherwise communicatively coupled to an example injection locking oscillator, in accordance with one or more aspects of the present disclosure.

Figure 3B:
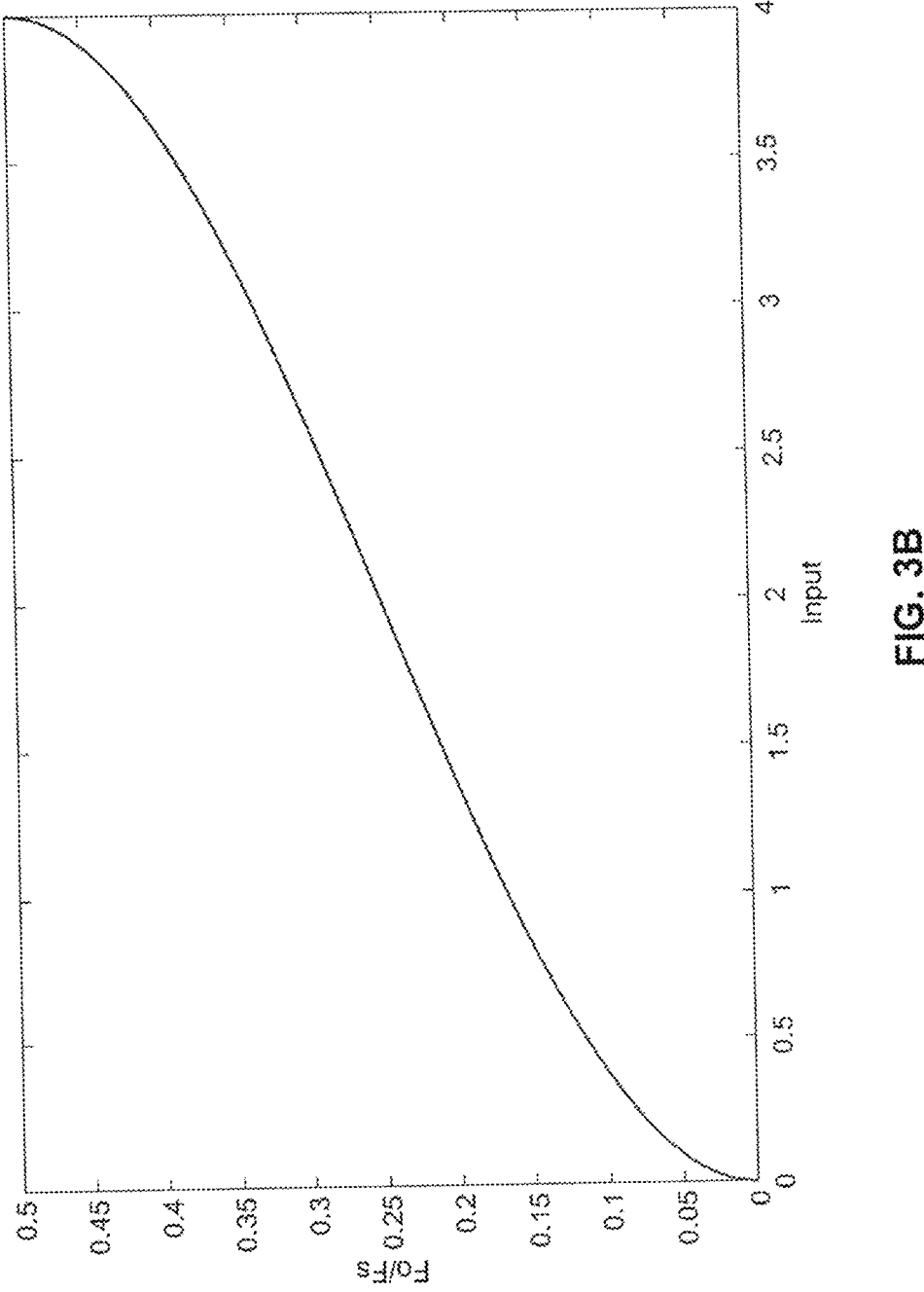

FIG. 3B is a graph diagram illustrating an example curve of frequency versus input (hopping code), in accordance with one or more aspects of the present disclosure.

Figure 3C:
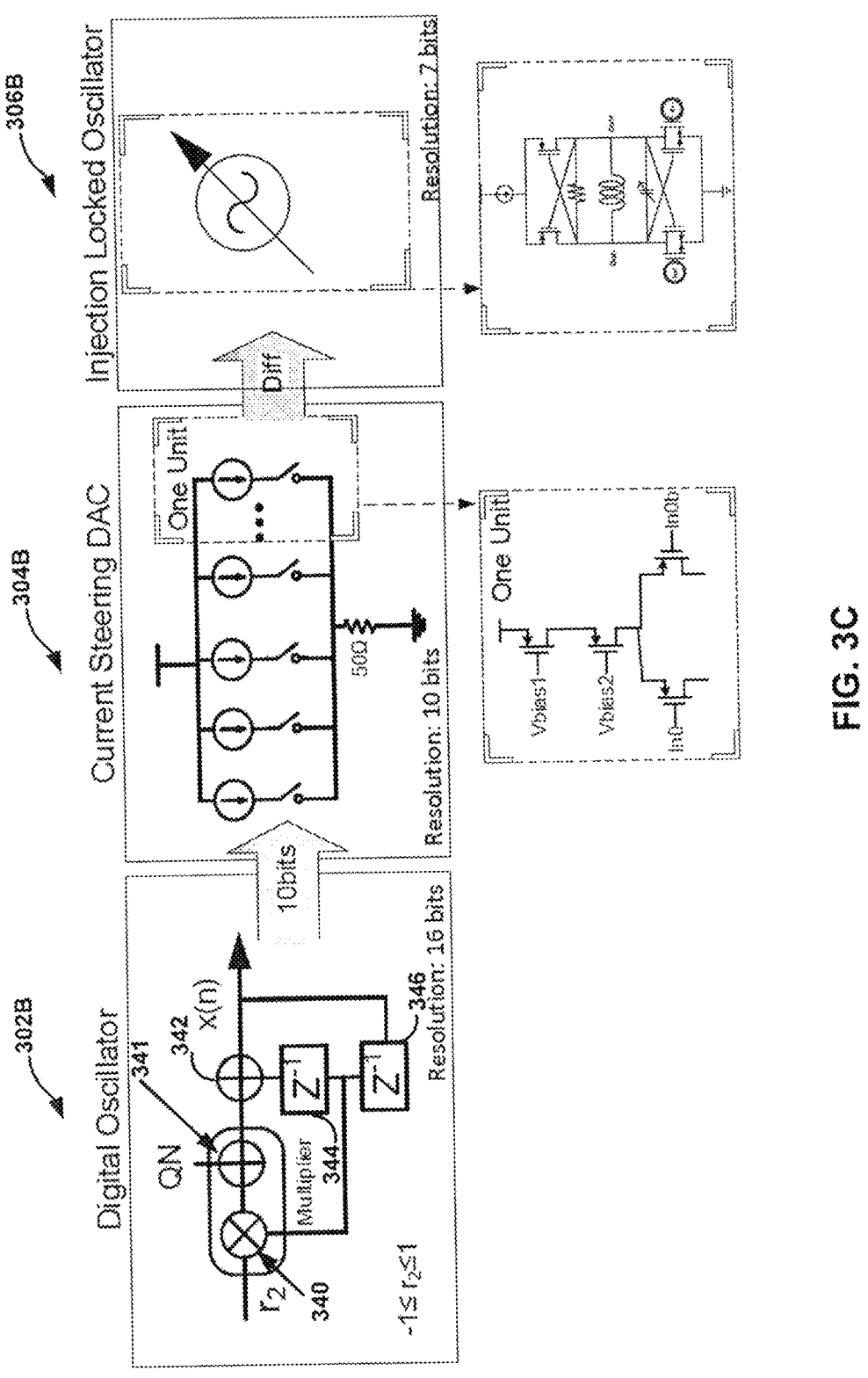

FIG. 3C is a diagram illustrating another example digital oscillator that includes or is otherwise communicatively coupled to an example injection locking oscillator, in accordance with one or more aspects of the present disclosure.

Figure 4A:
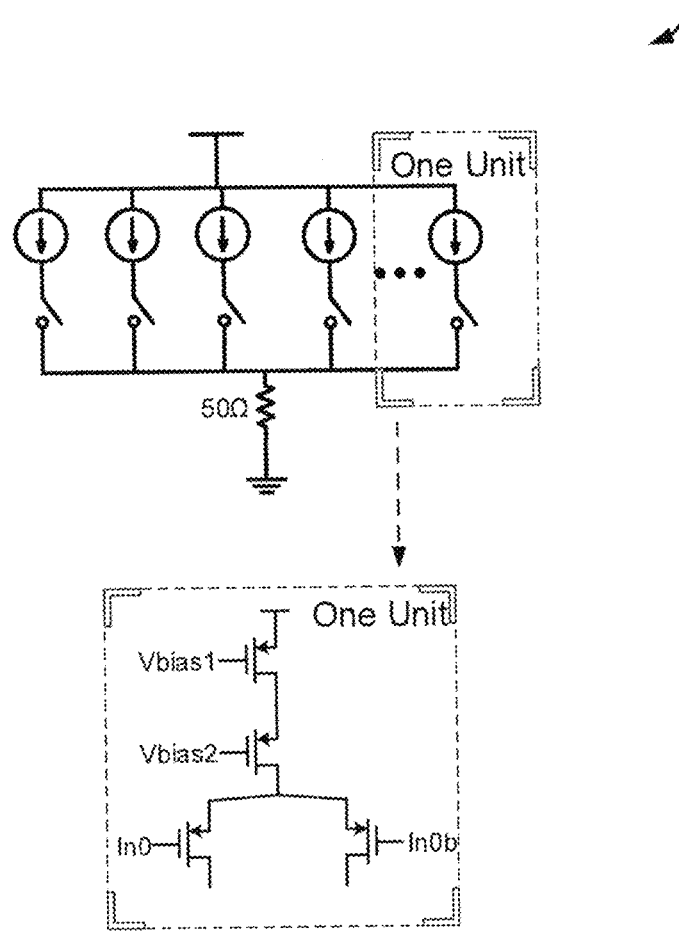

FIGS. 4A-4C are diagrams illustrating examples of a current-based DAC, a resistor-based DAC, and a capacitor-based DAC, in accordance with one or more aspects of the present disclosure.

Figure 5A:
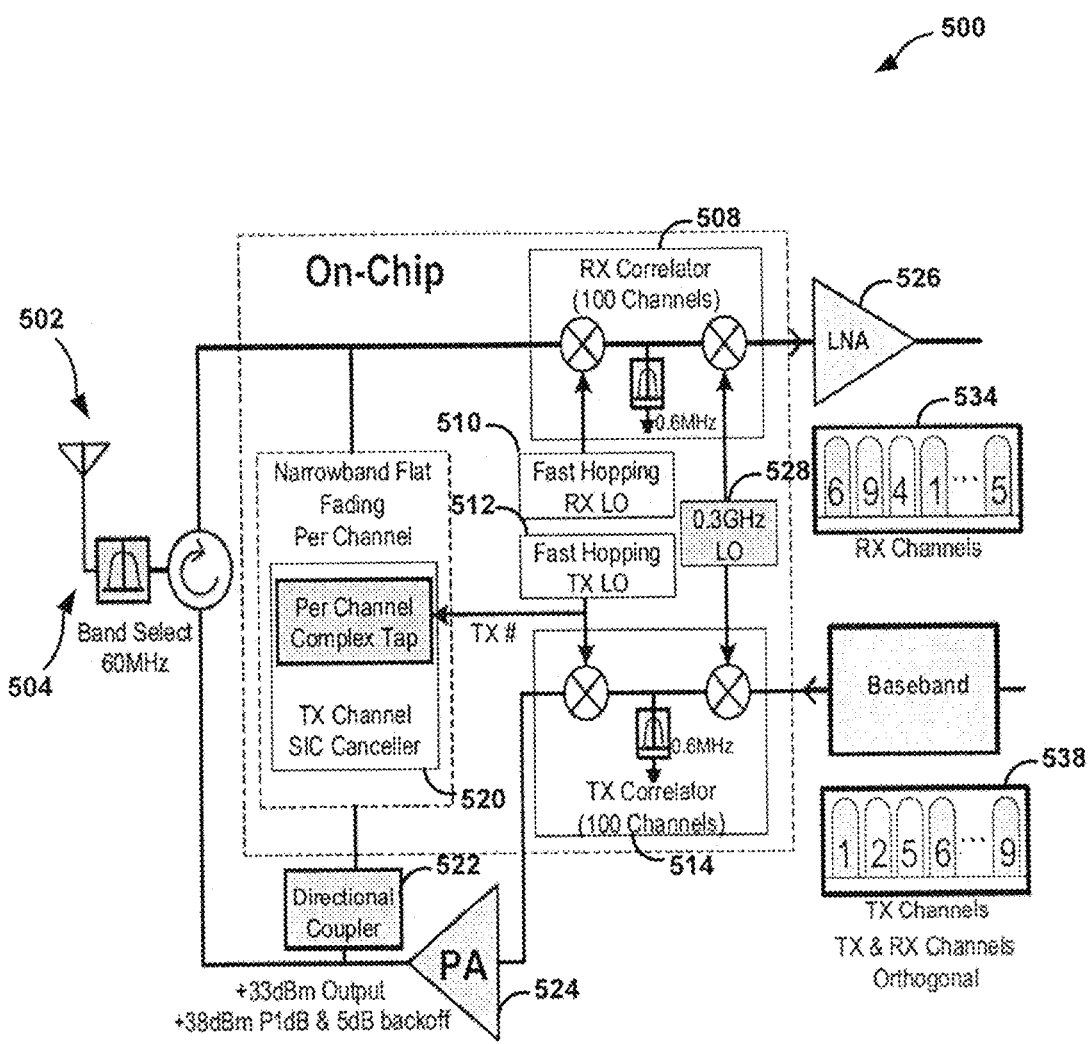
Figure 5C:
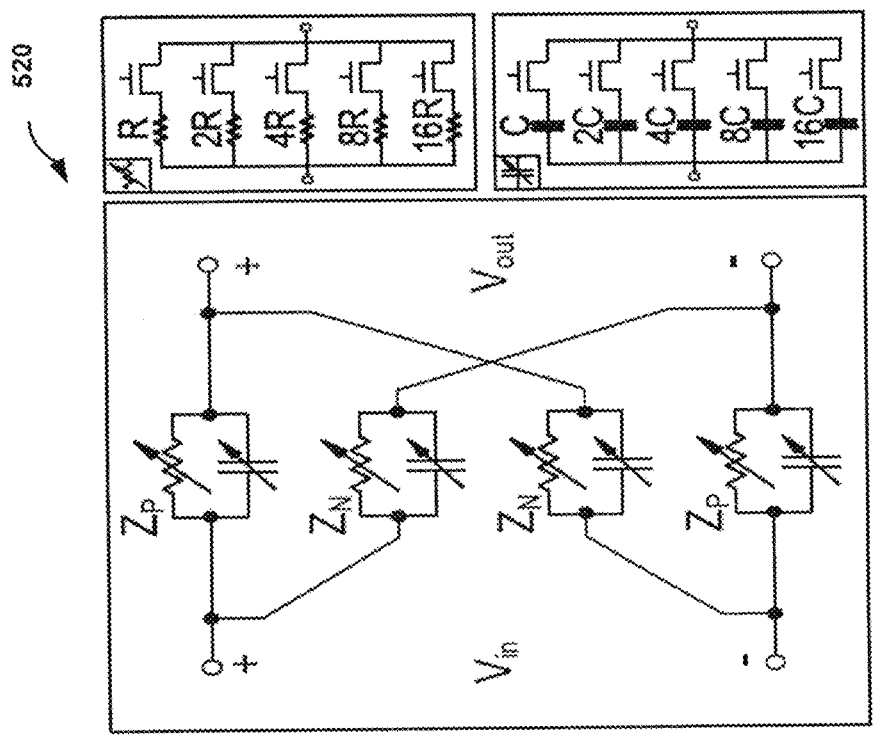
Figure 5B:
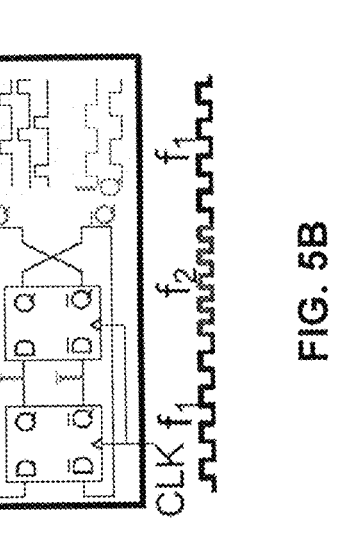

FIGS. 5A-5C are diagrams illustrating an example of multiple programmable digital oscillators coupled to transmitter and receiver correlator circuitry, in accordance with one or more aspects of the present disclosure.

FIG. 6 is a diagram illustrating an example digital oscillator transfer function, in accordance with one or more aspects of the present disclosure.

Figure 7:
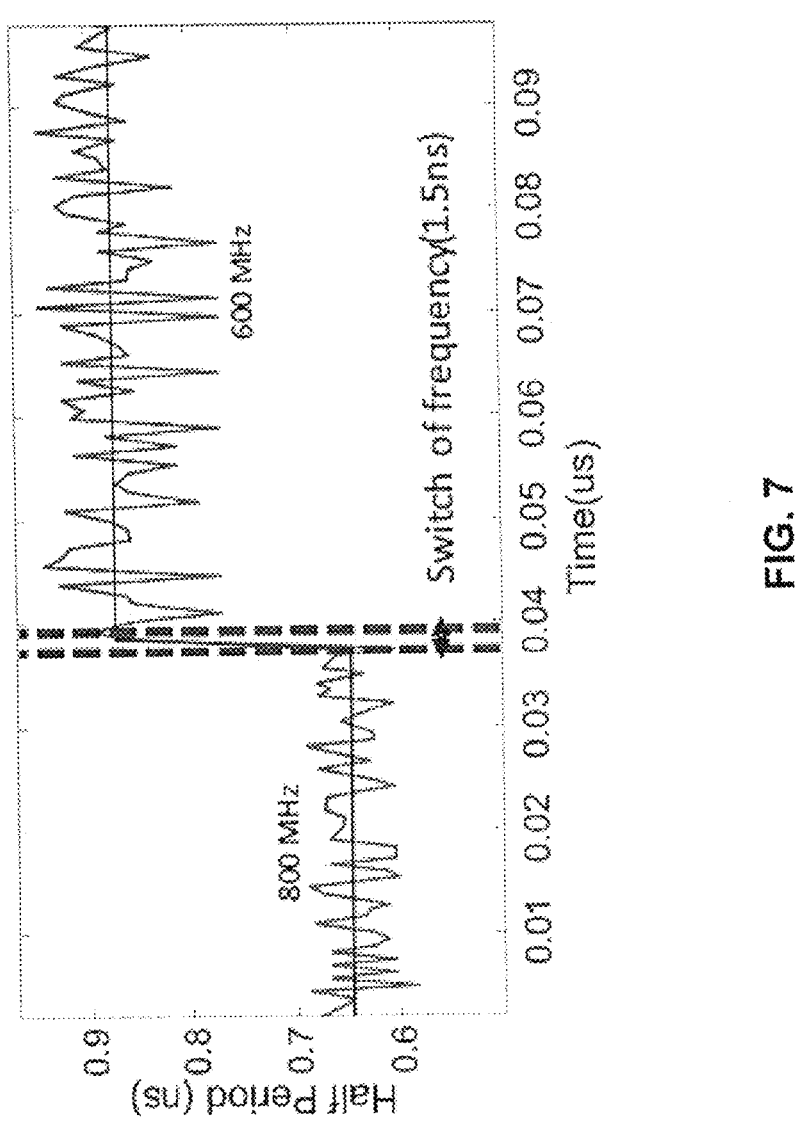

FIG. 7 is a graph diagram illustrating an example of measure hopping speed for a digital oscillator and DAC, such as those illustrated in FIGS. 2-3 or FIG. 5A, in accordance with one or more aspects of the present disclosure.

Figure 8:
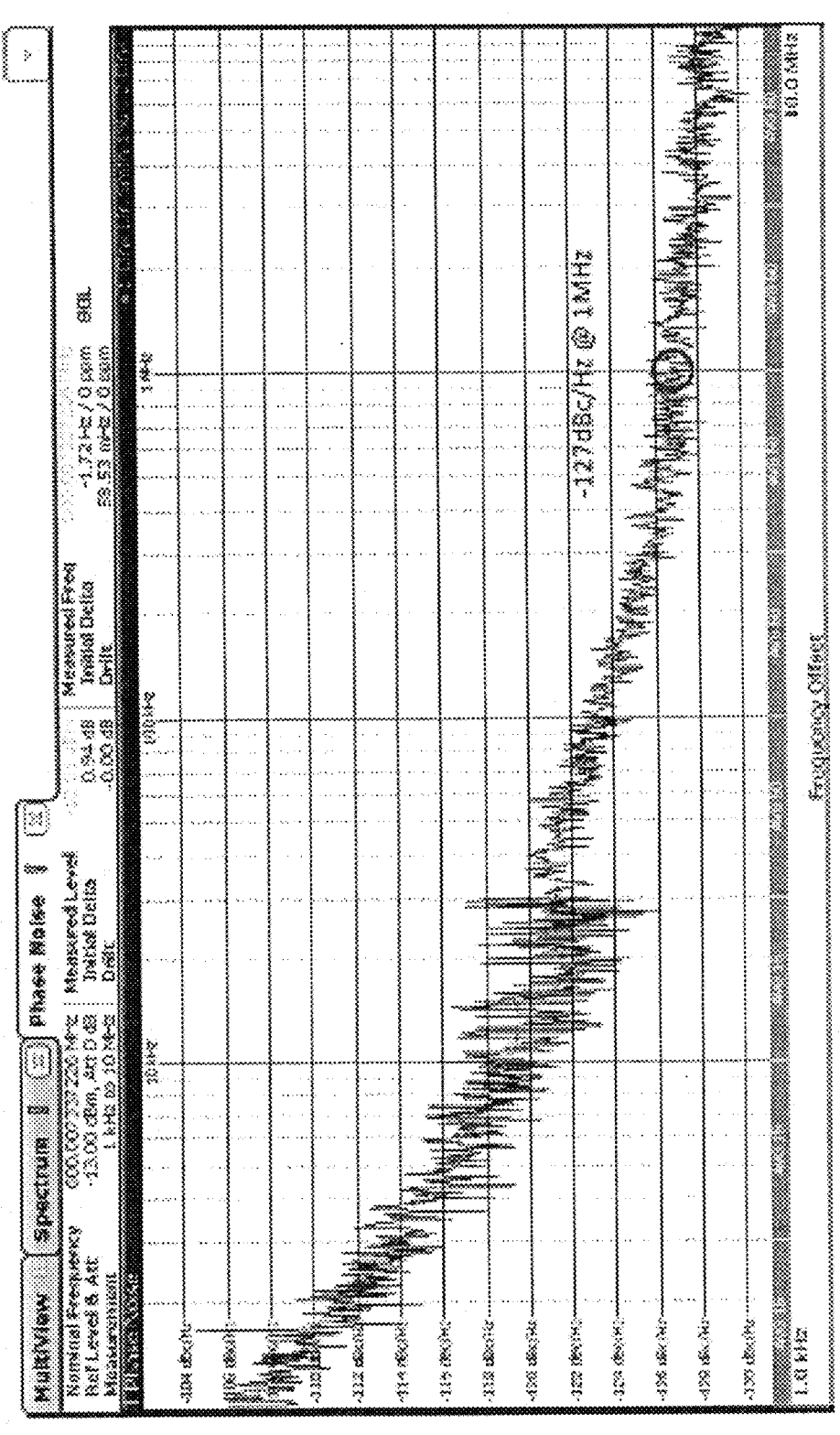

FIG. 8 is a graph diagram illustrating an example of measure phase noise for a digital oscillator and DAC, such as those illustrated in FIGS. 2-3 or FIG. 5A, in accordance with one or more aspects of the present disclosure.

Figure 9:
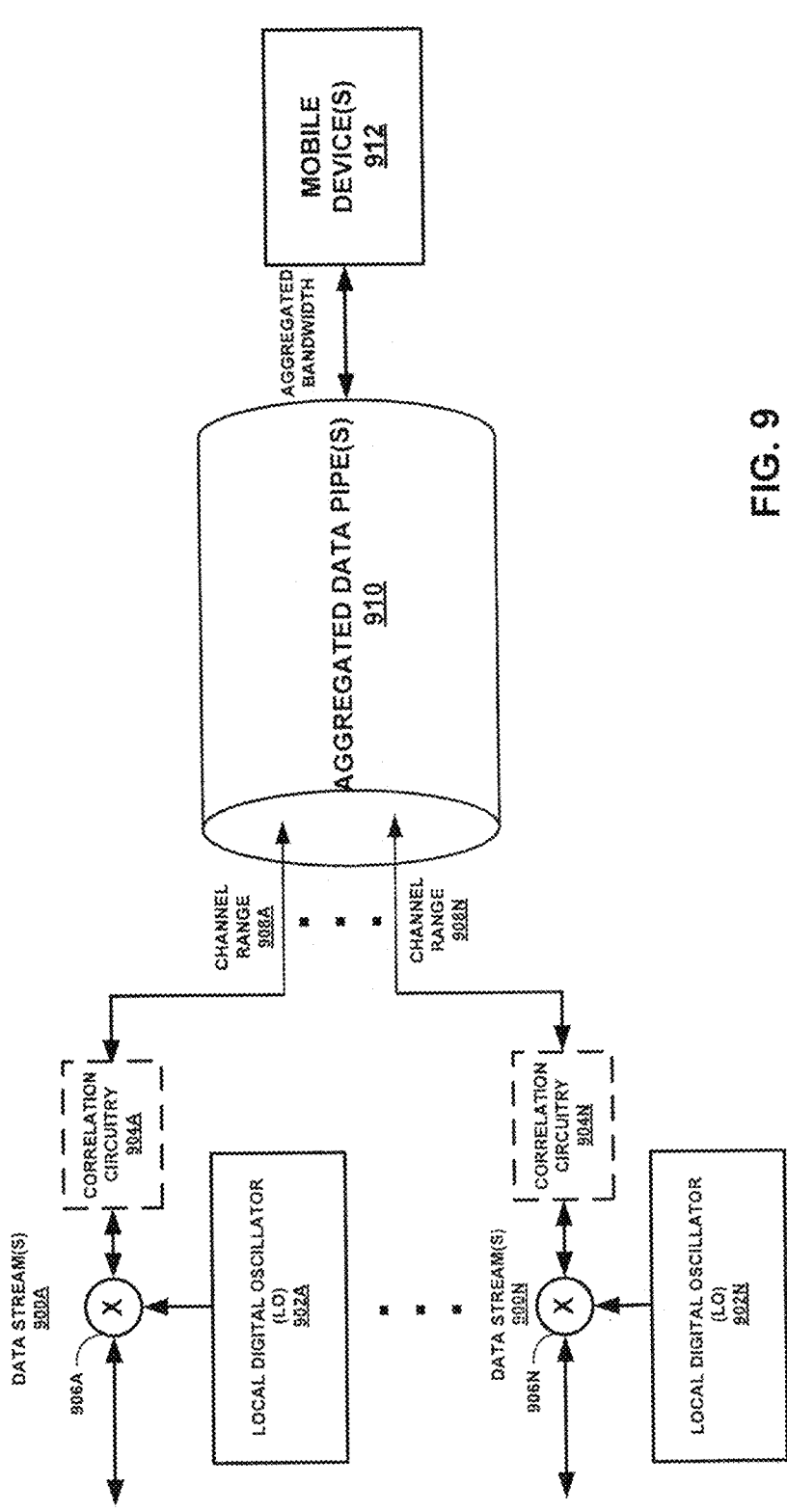

FIG. 9 is a conceptual diagram illustrating an example of carrier stream aggregation using a system of digital oscillators, in accordance with one or more aspects of the present disclosure.

Figure 10:
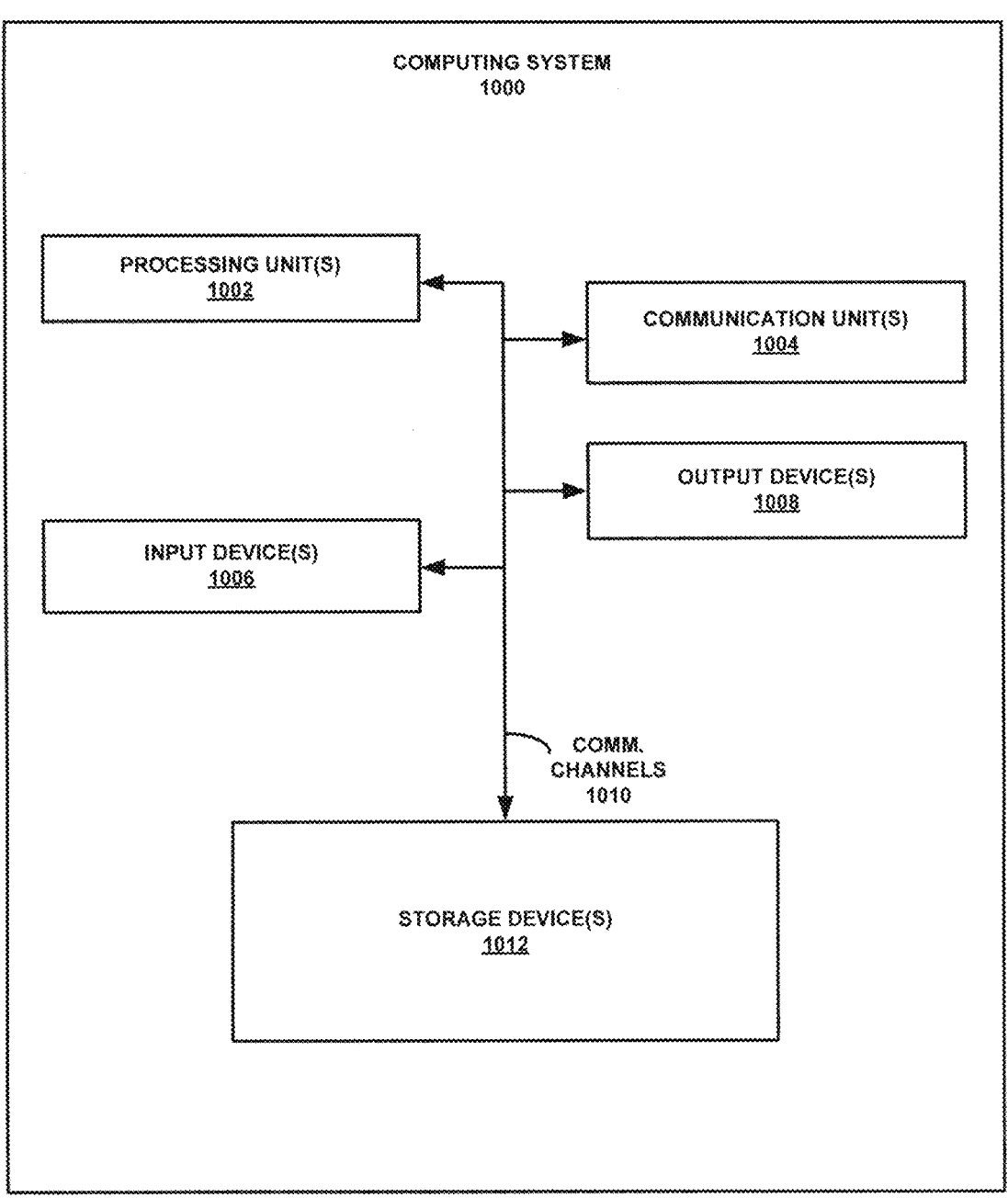

FIG. 10 is a block diagram illustrating an example computing system, in accordance with one or more aspects of the present disclosure.

DETAILED DESCRIPTION

As noted above, various prior techniques have been developed to generate custom signals, such as custom oscillation signals. However, many of these prior techniques suffer from high circuit complexity and power consumption. The present disclosure describes techniques for implementing and using a digital oscillator (e.g., digital sine-wave oscillator) that has lower circuit complexity, lower power consumption, and higher-speed operation. This digital oscillator may include only one multiplier and integrator combination. In various examples, the output frequency of the digital oscillator may be programmable/tunable, and may be centered around fs/4, where fs is the sampling clock frequency. As will be described in further detail below, setting α=0 for the digital oscillator results the output frequency to be exactly at fs/4, where a is the programmable hopping code. In various examples, the output frequency of the digital oscillator can go anywhere between 0 to fs/2, as a function of the programmable hopping code. The output of the digital oscillator may also then be converted to an analog value using an on-chip digital-to-analog converter. The digital oscillator described herein may be used in various applications, such as radar applications (e.g., frequency-modulated continuous wave radar applications) and carrier aggregation applications.

It is noted that any and all specific parameters, numbers, operating conditions, or other values (e.g., channels, frequencies, hopping rates, gains, etc.), which may be recited herein, are included as non-limiting examples, for purposes of illustration only. Any number of different parameters, numbers, operating conditions, or other values may be used in alternate examples, and are fully within the scope of the claims.

Figure 1:
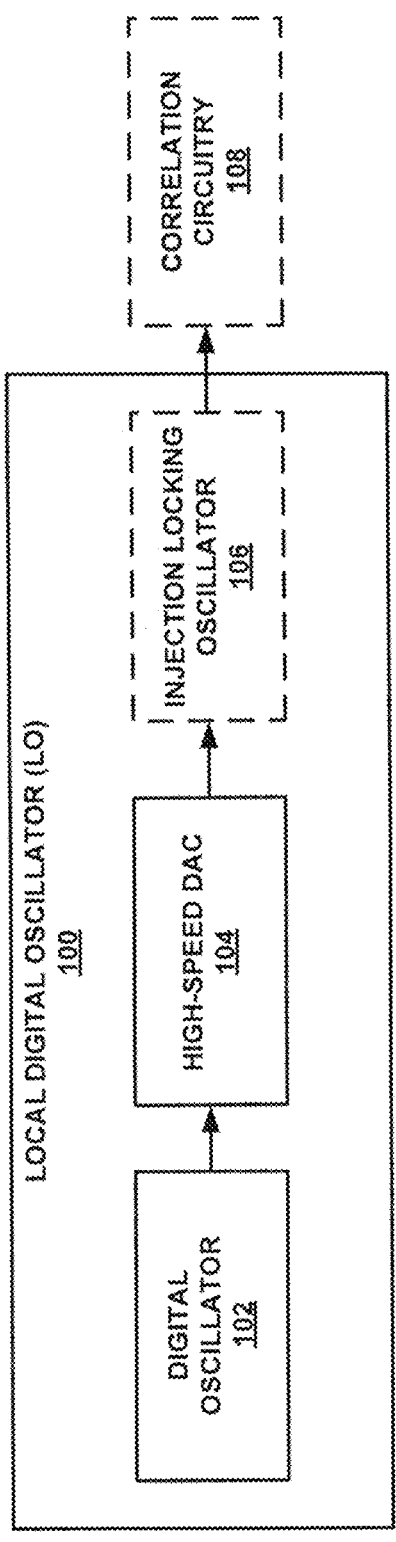
FIG. 1 is a block diagram illustrating an example of a programmable digital oscillator, in accordance with one or more aspects of the present disclosure.

FIG. 1 is a block diagram illustrating an example of a programmable digital oscillator, in accordance with one or more aspects of the present disclosure. In the example of FIG. 1, local digital oscillator 100 includes a digital oscillator 102, a high-speed DAC 104, and an optional injection locking oscillator 106. In some cases, local digital oscillator 100 may be communicatively coupled to optional correlation circuitry 108, such as the transmitter correlator or receiver correlator shown in FIGS. 5A-5C. The digital oscillator and current-steering DAC shown in FIGS. 2-3 are non-limiting examples of digital oscillator 102 and high-speed DAC 104 shown in FIG. 1, and the injection locking oscillator shown in FIG. 3A and/or 3C is a non-limiting example of injection locking oscillator 106 shown in FIG. 1.

In non-limiting examples, digital oscillator 102 may comprise digital oscillation circuitry that includes exactly one digital multiplier, exactly one digital adder, and exactly two registers, where the digital oscillation circuitry is configured to provide digital oscillation signals at one or more frequencies as a function of a programmable code, and where the programmable code is provided as input to the exactly one digital multiplier. High-speed DAC 104 may be configured to convert the digital oscillation signals from the digital oscillation circuitry into analog oscillation signals.

In certain examples, the programmable code comprises a programmable hopping code. In these examples, the digital oscillation circuitry of digital oscillator 102, which may comprise a fast-hopping digital oscillator, is configured to provide the digital oscillation signals at the one or more frequencies as a function of the programmable hopping code. In certain other examples, the programmable code may comprise a code that does not hop (e.g., for one or more Long-Term Evolution (LTE) applications).

In some examples, the programmable code comprises a programmable, continuously changing ramp code. In these examples, the digital oscillation circuitry of digital oscillator 102 is configured to provide the digital oscillation signals at the one or more frequencies as a function of the programmable, continuously changing ramp code, and local digital oscillator 100 is configured to provide the analog oscillation signals for use with frequency-modulated continuous wave radar applications (e.g., applications for use with autonomous vehicle technology).

In some examples, the digital oscillation circuitry is associated with a transfer function $z^{-2}+r_2z^{-1}+1=0$, wherein $r_2$ represents the programmable code, and wherein $z^{-1}$ and $z^{-2}$ represent respective Z transforms. High-speed DAC 104 may comprise, in some cases, an 8-bit DAC, and the digital oscillation signals may comprise 8-bit signals. In different examples, high-speed DAC 104 may be one of a current-based DAC, a resistor-based DAC, or a capacitor-based DAC.

In some examples, the digital oscillation circuitry provides the digital oscillation signals at the one or more frequencies that are centered around fs/4 based on the code, where fs is a sampling clock frequency for the digital oscillation circuitry. In various examples, the output frequency of the digital oscillator can range anywhere between 0 to fs/2, based on the programmable code. Optional injection locking oscillator 106, which is communicatively coupled to high-speed DAC 104, may function as a bandpass filter with respect to the analog oscillation signals. Injection locking oscillator 106 may comprise, in certain examples, a high-Q fast hopping injection locked bandpass filter that is used for filtering to improve out-of-band performance. Injection locked oscillator 106 may be configured to jump to a new frequency instantaneously by changing the center frequency to a new value.

In some examples, high-speed DAC 104 may be an 8-bit DAC, and the digital oscillation signals may comprise 8-bit signals. In some examples, high-speed DAC may be one of a current-based DAC, a resistor-based DAC, or a capacitor-based DAC.

FIG. 2A is a diagram illustrating an example of digital oscillator 202A, along with example phase information, in accordance with one or more aspects of the present disclosure. A popular approach to synthesize custom signals is via DDS (direct digital synthesis). The problem with this approach, however, is circuit complexity and high-power consumption. To mitigate these issues, an all-digital, ultra-fast hopping signal generator, such as a sine-wave digital oscillator (DO) 202A, is described herein and shown in FIG. 2A. Prior architectures of digital oscillators were not intended for high-speed operation. The digital oscillator described herein, and as shown, e.g., digital oscillator 202A in FIG. 2A, utilizes lower power and has higher-speed operation. The design shown in FIG. 2A utilizes one additional register in comparison to prior architectures, but the number of integrators and multipliers is halved in comparison to prior architectures.

As shown in FIG. 2A, oscillator 202A includes one multiplier 240, one adder (e.g., summation) circuit 242, and two registers 244, 246. The output frequency of DO 202A is centered around $f_s/4$ where $f_s$ is the sampling clock frequency. The value of $\alpha$ (e.g., hopping code) sets the output frequency. Setting $\alpha=0$ results in an output frequency of $f_s/4$. The value of $\alpha$ may also be referred to as "r2", such as shown in FIG. 2B, and r2 may be in the range of $-1 \le r2 \le 1$. The digital output of DO 202A is converted to an analog value using an on-chip current steering DAC (see, e.g., current steering DAC 204A in FIG. 2C). In this design, an 8-bit DAC is sufficient to maintain the required phase noise for the minimum sensitivity of the receiver when a high-Q fast hopping injection locked bandpass filter is used for filtering. The DAC resolution does however, affect close-in spurs and is discussed later. The high-Q filter may be utilized for improved out-of-band performance. FIG. 2A illustrates continuous phase between frequency jumps. Digital oscillator 202A may provide an 8-bit output, as shown.

In the example of FIG. 2A, the digital oscillation circuitry includes exactly one digital multiplier 240, exactly one digital adder 242, and exactly two registers 244/246, where the hopping code is provided as input to the exactly one digital multiplier 240 of the transmission digital oscillation circuitry. In certain examples, the illustrated digital oscillation circuitry may be associated with a transfer function $z^{-2}+r_2 z^{-1}+1=0$, wherein $r_2$ represents the hopping code, and wherein $z^{-1}$ and $z^{-2}$ represent respective Z transforms.

As shown in FIG. 2A, register 244 is electrically coupled to register 246. Digital multiplier 240 is electrically coupled to digital adder 242 and to each of registers 244 and 246. Digital adder 242 is electrically coupled to digital multiplier 240 and to each of registers 244 and 246.

FIG. 2B illustrates another example of a digital oscillator 202B, where multiplier 240 further includes a quantitation noise (QN) source 241. Digital oscillator 202B may provide an 10-bit output, as shown.

As shown in FIG. 2B, register 244 is electrically coupled to register 246. Digital multiplier 240 is electrically coupled to digital adder 242 and to each of registers 244 and 246. Digital adder 242 is electrically coupled to digital multiplier 240 and to each of registers 244 and 246.

The DO model with quantization noise is shown in FIG. 2B, where the input coefficient to DO 202BB, r2 (e.g., the hopping code), sets the oscillation frequency. Therefore, the quantization noise due to finite computation accuracy may cause perturbations in the oscillation frequency, i.e., phase noise. In certain cases, the only contributor to quantization noise is digital multiplier 202B. In general, if two operations of w bits are multiplied, then the resultant can have a maximum of 2 w bits. However, in various examples, the output is also limited to w bits, as r2 is limited by ±1, which bounds the quantization noise.

The quantization noise distribution for a multiplier (e.g., multiplier 240) where one of the inputs is a constant is the same as the quantization noise from a regular quantizer (i.e., ADC). Thus, the analysis can be simplified in certain examples by assuming that the quantization noise can be modeled as an additive white noise. Using phase noise analysis methods similar to continuous-time LC oscillators, an analytical model is used for the phase noise contribution of the computational accuracy of digital oscillators. This analytical model is used to derive the phase noise at 100 KHz and 1 MHz offsets for 8-16 bits of accuracy. The DO (e.g., oscillator 202B) generates a binary sample-and-hold sinusoidal signal with W bit resolution. The DO output is then converted to the analog domain by a DAC (e.g., DAC 204A shown in FIG. 2C). Because one goal is to hop rapidly between frequencies, a memoryless DAC, i.e., not a sigma-delta, may be used. The output from the Mbit DAC is then filtered by an ILO (injection-locked oscillator) with very high Q to remove the unwanted harmonics. ILOs can act as high-Q bandpass filters that can jump frequencies almost instantly. The fast-hopping nature of the DO, the DAC, and the ILO enables the LO frequency to change almost instantaneously. The settling time is primarily limited by the digital circuits that provide the control signals. FIG. 2B illustrates continuous phase between frequency jumps.

FIG. 2C is a diagram illustrating an example digital oscillator 202A of FIG. 2A coupled to a current-steering DAC 204A, along with example current steering information. The digital oscillator 202A and current-steering DAC 204A shown in FIG. 2C are non-limiting examples of digital oscillator 102 and high-speed DAC 104 shown in FIG. 1.

The top left-hand side of FIG. 2C illustrates an example structure of digital oscillator 202A. The top right-hand side of FIG. 2C illustrates an example current-mode, or current-based, 8-bit DAC 204A. The bottom right-hand side of FIG. 2C illustrates further details of current-steering DAC 204A.

The 25% duty cycle clocks required to drive a 4-Path filter are realized using flip-flops and logic. The left-hand mixer down-converts the RF signal to direct current (DC) and the right-hand mixer up-converts the DC baseband signal to a desired fixed RF signal. The second mixer is included to take advantage of the ultra-low noise amplifiers available on the market to minimize the overall receiver noise figure (NF). In some examples, the second mixer can be replaced by baseband circuits to realize a frequency hopped mixer-first receiver. An N-path filter coupled to the current-steering DAC is able to hop from one frequency to another almost instantaneously because of the all digital 25% clock dividers and because the signal history is only maintained at DC on the baseband capacitors.

The digital output of DO 202A is converted to an analog value using the on-chip current steering DAC 204A. In this design, an 8-bit DAC is sufficient to maintain the phase noise for the minimum sensitivity of the receiver when a high-Q fast hopping injection locked bandpass filter is used for filtering. The DAC resolution does however, affect close-in spurs. The high-Q filter may be utilized for improved out-of-band performance.

In other examples in which oscillator 202B of FIG. 2B is used with a DAC, the DAC may comprise a 10-bit DAC, based on the 10-bit output provided by oscillator 202B, such as is shown in FIG. 2D. In FIG. 2D, oscillator 202B is coupled and used with DAC 202B. DAC 202B may be a 10-bit DAC, based on the 10-bit output provided by oscillator 202B.

FIG. 2E is a graph illustrating power consumption and maximum clock frequency with respect to embodiments of the disclosed digital oscillator in comparison to designs of direct digital synthesis (DDS) circuits. As noted earlier, one popular approach to synthesize custom signals is via DDS. The problem with this approach, however, is circuit complexity and high-power consumption. DDS circuits are designed to generate any custom periodic signal and therein lie their disadvantage. The techniques of the present disclosure provide, in various examples, local digital oscillators that generate the local oscillation signal only. The local oscillation signal can be, in certain non-limiting cases, either a sine wave or a square wave. In comparison to one or more designs of digital oscillator of the present disclosure, as represented at plot point 255 in FIG. 2E, DDS circuits consume significantly more power, as represented by the plot points other than 255 in FIG. 2E. This can be intuitively explained due to the limited function of the digital oscillator, which generates, e.g., a sine wave or square wave only, while DDSs often generate any type of periodic signal. In addition, due to its operational mode, the digital-to-analog converter (DAC) resolution in the signal generator of various examples of the presently disclosed digital oscillator can be of a lower resolution. In addition, the power consumption of various examples of the presently disclosed digital oscillator in mW/GHz is an order of magnitude smaller than prior DDS designs.

FIG. 3A is a block diagram illustrating an example digital oscillator 302A that includes or is otherwise communicatively coupled to an example injection locking oscillator 306A, in accordance with one or more aspects of the present disclosure. FIG. 3A is similar to FIG. 2C but additionally shows the coupling of example current-steering DAC 304A (one example of DAC 104 shown in FIG. 1) to injection locking oscillator 306A (one example of injection locking oscillator 106). Similar to oscillator 202A from FIG. 2C, digital oscillator 302A shown in FIG. 3A includes multiplier 340, adders 342, and registers 344/346.

FIG. 3B is a graph diagram illustrating an example curve of frequency versus input (hopping code), in accordance with one or more aspects of the present disclosure. As described previously, in various examples, the output frequency of the digital oscillator can range anywhere between 0 to fs/2, based on the programmable hopping code. FIG. 3B illustrates an example curve of frequency versus input, where the input is the programmable hopping code, $F_o$ is the output frequency of the digital oscillator, and Fs is the sampling clock frequency for the digital oscillation circuitry.

FIG. 3C is a diagram illustrating another example digital oscillator 302B that includes or is otherwise communicatively coupled to an example injection locking oscillator 306B, in accordance with one or more aspects of the present disclosure. FIG. 3C is similar to FIG. 2D but additionally shows the coupling of the example current-steering DAC 304B to injection locking oscillator 306B. Similar to oscillator 202B of FIG. 2D, oscillator 302B shown in FIG. 3C includes digital multiplier 340 that includes quantization noise source 341, digital adder 342, and registers 344/346. In the example of FIG. 3C, digital oscillator 302B may have a resolution of 16 bits, DAC 304B may have a resolution of 10 bits, and injection locked oscillator 306B may have a resolution of 7 bits.

The transfer function for digital oscillator 302B is given in equation (1) below, according to certain examples. The input $r_2$, limited to −2 to 2, is the frequency control variable in the transfer function, and the roots of the resulting characteristic equation gives the oscillating frequency. Therefore, the poles can be written as shown in equation (2). As a result, the precise output frequency can be simplified to equation (3).

$$x(n-2)+r_2x(n-1)+x(n)=0 \tag{1}$$

$$z_{1,2} = \frac{-r_2}{2} \pm j\sqrt{1 - \frac{r_2^2}{4}} = e^{\pm j cos^{-1}\left(\frac{r_2}{2}\right)} \tag{2}$$

$$f_{out} = \frac{f_{clk}cos^{-1}\left(\frac{r_2}{2}\right)}{2\pi} \tag{3}$$

When $r_2=0$, $$f_{out} = \frac{f_{clk}cos^{-1}(0)}{2\pi} = \frac{f_{clk}}{4}.$$

The output frequency range can be varied from near 0 to $$\frac{f_{clk}}{2}.$$

At a given input $r_2$ [−2, 2], when $r_2=2$, $f_{out}=0$, and when $$r_2 = -2, f_{out} = \frac{f_{clk}}{2}$$

the digital oscillator (e.g., oscillator 302B) can be seen as a bandpass filter, which amplifies the frequency of interest and suppresses the out of band signal. In a transceiver, the phase noise of the oscillator has significant impact on the error vector magnitude (EVM) and on jammer performance due to reciprocal mixing. The total phase noise will include the contributions from: 1) the input clock; 2) the digital oscillator; and 3) the LO DAC (e.g., DAC 304B) and injection locked oscillator (ILO) and duty cycle generators for the correlators.

FIGS. 4A-4C are diagrams illustrating examples of a current-based DAC, a resistor-based DAC, and a capacitor-based DAC, in accordance with one or more aspects of the present disclosure. High-speed DAC 104 shown in FIG. 1 may, in various examples, implement one of the types of DAC's illustrated in FIGS. 4A-4C.

FIG. 4A shows an example of a current-based DAC, such as shown in the examples of FIGS. 2-3. FIG. 4B shows an alternate example of a resistor-based DAC. FIG. 4C shows yet another alternate example of a capacitor-based DAC.

FIGS. 5A-5C are diagrams illustrating an example of multiple programmable digital oscillators coupled to transmitter and receiver correlator circuitry, in accordance with one or more aspects of the present disclosure. As FIG. 5A shows, a receiver (RX) programmable fast-hopping digital oscillator, RX local oscillator (LO) 510, is communicatively coupled to receiver correlator circuitry 508. A transmitter (TX) programmable fast-hopping digital oscillator, TX LO 512, is communicatively coupled to transmitter correlator circuitry 514. Receiver digital oscillator 510 and transmitter digital oscillator 512 may each be non-limiting examples of digital oscillator 100 shown in FIG. 1.

FIG. 5A illustrates an example of a transceiver 500. In the example of FIG. 5, direct self-interference is avoided by utilizing orthogonal channels for the transmitter and receiver. That is, in this example, the transmitter and receiver never occupy the same channel at any given time. The transmitter may include transmitter correlator 514 and fast-hopping transmitter local oscillator (TX LO) 512. The receiver may include receiver correlator 508 and fast-hopping receiver local oscillator (RX LO) 510. Each local oscillator (e.g., TX LO 512, RX LO 510) may comprise a digital oscillator. In some examples, to accommodate a 470 Kbit/s data rate and 20 dB of blocker suppression, a hopping speed of 47 Mhop/s is used for the frontend. A 4-path filter is used that is tuned to one of the channels at any point in time. Being passive, the filter is highly linear with noise performance that may be limited by its load termination, e.g., the low-noise amplifier (LNA) 526. Even with the 25 dB suppression from the duplexer, about 8 dBm of transmit power shows up at the receiver frontend (e.g., at the front end of receive correlator 208). An all passive self-interference cancellation circuit 520 is used to suppress this transmit channel interference (orthogonal from the RX channel) from overloading the receiver frontend. The transmit channels may include channels 538, and the receive channels may include channels 534.

A 60 MHz band-select filter 504 may be used directly after antenna 502 to suppress any out of-band interference. The fast hopping local oscillator signals for the transmitter/receiver (e.g., signals for TX LO 512, signals for RX LO 510) are generated using programmable ultra-fast hopping digital oscillators (DO). Two separate DOs (e.g., RX LO 510, TX LO 512) may be used as the transmit and receive channels are orthogonal. An external power amplifier (PA) 524 is used to generate the +33 dBm output required. A portion of PA 524 output is coupled via a directional coupler 522 to on-chip self-interference canceller (SIC) 520.

A 0.3 GHz digital local oscillator 528 also may optionally be included in the design shown in FIG. 5A. This 0.3 GHz digital oscillator 528 may be communicatively coupled to receiver correlation circuitry 508 and to transmitter correlation circuitry 514, and may be configured to provide an offset to the one or more transmit signals arriving at transmitter correlator 514, and/or to the de-spread one or more frequency-hopped data signals output by receiver correlator 508.

FIGS. 5B-5C illustrate example circuit details for the transmit and receive correlators and SIC circuitry. For example, FIG. 5B illustrates example circuit details for receiver correlator 508 and/or transmitter correlator 514, while FIG. 5C illustrates example circuit details for SIC circuitry 520. The transmit and/or receiver correlators 514/508 are implemented as a set of four-phase passive mixers with 25% duty cycle clocks, as shown in FIG. 5B. The correlator design is essentially identical to an N-path structure except that the input and output mixers are operated at different frequencies. In an N-Path filter, both mixers are operated at the same frequency, and usually, one is removed from the design for improved noise performance. Here, the dual-mixer format is maintained for flexibly and for improved out-of-band performance.

For transmitter correlator 514, the input mixers are connected to a fixed-frequency LO, and the other one is driven by an ultra-fast FH LO (e.g., TX LO 512). The input data are down-converted to baseband from a fixed RF center frequency and up-converted back to RF using the fast-hopping LO signal. The same circuit is used for the receiver correlator 508 but with opposite directions. When synchronized, receiver correlator 508 down-converts the received hopping signal on the baseband capacitors. The received signal is then up-converted to a fixed frequency and further processed by a receiver (e.g., a commercial, off-the-shelf receiver). The switches are implemented using 1 V RF nMOS devices, and they have $3\Omega$ series resistance when they are ON. The baseband capacitors are implemented using only MIM capacitors so that the linearity is only limited by the nMOS switches. The 25% duty cycle clocks are generated using a divide-by-two flip-flop loop and standard logic operations.

The correlator is an RF bandpass filter that changes the center frequency according to the LO signal (e.g., signal from RX LO 510 for receiver correlator 508, signal from TX LO 512 for transmitter correlator 514). Hence, if two tones exist in-band, they will generate a third order intermodulation product (IM3) products that may fall in-channel. A low-frequency LTI model for N-path filters is used to develop an analytical model to evaluate the ratio between in-band third order intercept point (IIP3) and out-of-band IIP3 for the design. The large jammer causes VGS of the switch to vary. As the frequency moves away from the channel center, the capacitor becomes more of a short reducing the signal amplitude of the jammers. In various examples, the channel hops but the jammers are assumed to be stationary. However, for a simpler analysis, the channel may be stationary and the jammers hop. In certain non-limiting example, there are a total of 100 channels but only certain combinations of two tones fall in-band.

Due to high PA power, SIC circuit 520 may be very linear suggesting a passive structure. The circuit may also have minimal impact on the noise figure (NF) of the receiver. As shown in FIG. 5C, SIC circuit 520 is implemented using resistors, capacitors, and switches, where the design may use an R-2R and C-2C ladder networks, with binary resister and capacitor ratios. Both designs start with the NF consideration first. In some cases, a 200 Q resistor only degrades the NF by 0.5 dB when the receiver NF is 1 dB. This means that the smallest combination of the resistors in the circuit are larger than 200 $\Omega$s. The capacitors are then sized accordingly. The switches are located on the receive side where cancellation occurs, as they do not see large voltage swings. The circuit does not consume any DC power. Dynamic power is small due to slow reconfiguration speed which, at maximum, only operates at the hop rate.

FIG. 6 is a diagram illustrating an example digital oscillator transfer function, in accordance with one or more aspects of the present disclosure. As shown in FIG. 6, the digital oscillation circuitry described herein and shown in FIGS. 1-5 may be associated with a transfer function $z^{-2} + r_2 z^{-1} + 1 = 0$, wherein $r_2$ represents the hopping code, and wherein $z^{-1}$ and $z^{-2}$ represent respective Z transforms. The improved design of the digital oscillator described herein enables lower power and higher-speed operations through the implementation of fewer components (e.g., fewer multipliers and adders/integrators) and few computations.

FIG. 7 is a graph diagram illustrating an example of measured speed for a digital oscillator and a DAC, such as those illustrated in FIG. 2 or FIG. 3A, in accordance with one or more aspects of the present disclosure. In certain non-limiting examples, the front-end is fabricated in 65 nm RF complementary metal-oxide-semiconductor (CMOS) technology. FIG. 7 shows the measured transient time for the DO+DAC combination from 800 MHz to 600 MHz. The transient time is primarily due to digital circuits other than the DAC that has a 2 GHz signal bandwidth. To measure the frequency switch time, the DAC output was sampled with a 20 Gsps sampling scope that interpolates the sampled to 100 Gsps. The transient sampled output was lowpass filtered with a 100tap finite impulse response (FIR) filter in Matlab (FIR to maintain linear phase). The frequency of operation was estimated by evaluating the zero crossings so the time resolution is limited by one-half period, or roughly 0.67 ns at 750 MHz. The measured transient time from 800 MHz to 600 MHz is 1.5 ns or about 1 clock period within our measurement resolution limits. The measured power consumption for a 1 GHz DO output ($F_{clock}/4$) for the DO+DAC is 6 mW. The measured frequency accuracy of the digital oscillator is better than 20 ppm in this design. Simulations suggest that the accuracy is even better and may be limited by the frequency resolution of the measurement technique.

FIG. 8 is a graph diagram illustrating an example of measured phase noise of a digital oscillator and a DAC, such as those illustrated in FIG. 1, FIGS. 2C-2D, FIG. 3A, or FIG. 3C, in accordance with one or more aspects of the present disclosure. FIG. 8 shows the measured phase noise of the fast hopping clock generation circuit at a fixed frequency of 600 MHz. The measured phase noise for the circuit is −127 dBc/Hz at 1 MHz offset and for the signal source is −140 dBc/Hz at 1 MHz offset. Experimental explorations suggest that the phase noise deterioration may be mainly due to the small DAC termination resistor (limiting signal amplitude) and due to the AM-PM conversion of the source follower buffer (for probing purposes) included after the DAC output. Within the DO, 16-bit resolutions are used throughout to minimize phase noise deterioration. The finite 8-bit resolution of the DAC does not add to the phase noise directly but adds to the tonal behavior of DO+DAC combination. A higher resolution DAC and dithering techniques can further reduce this tonal behavior. No spurs were seen within the 10 MHz bandwidth used for phase noise measurements.

FIG. 9 is a conceptual diagram illustrating an example of carrier stream aggregation for uplink and/or downlink operations using a system of digital oscillators, in accordance with one or more aspects of the present disclosure. In FIG. 9, a digital oscillator system is provided that includes a plurality of digital oscillators, such as a group of 1-N local digital oscillators 902A-902N (hereinafter, "digital oscillators 902"), where N is greater than or equal to two. Each of digital oscillators 902 may be an example of one of the digital oscillators previously described, and may include digital oscillation circuitry having exactly one digital multiplier, exactly one digital adder, and exactly two registers, where the digital oscillation circuitry is configured to provide digital oscillation signals at one or more frequencies as a function of a programmable code of the respective one of digital oscillators 902. The programmable code is provided as input to the exactly one digital multiplier of the respective one of digital oscillators 902. Each of digital oscillators 902 may also include a DAC communicatively coupled to the digital oscillation circuitry, where the DAC is configured to convert the digital oscillation signals from the digital oscillation circuitry into analog oscillation signals. Each of digital oscillators 902 may also include coupling circuitry that is configured to communicatively couple the analog oscillation signals output by each respective digital oscillator with a respective data stream of a plurality of data streams 900A-900N (collectively, "data streams 900"), where each respective one of data streams 900 is received or transmitted via wireless communication channels within a respective wireless channel range, such as a radio frequency channel range.

For example, in FIG. 9, digital oscillator 902A may provide first analog oscillation signals, which may be coupled via coupling circuitry 906A (e.g., multiplier) with a first carrier data stream 900A that is received or transmitted via wireless communication channels within a first wireless channel range 908A. Digital oscillator 902N may provide second analog oscillation signals, which may be coupled via coupling circuitry 906N (e.g., multiplier) with a second carrier data stream 900N that is received or transmitted via wireless communication channels within a second wireless channel range 908N that is different from the first wireless channel range. Data stream 900A and data stream 900N may be aggregated via one or more aggregated data pipes 910 to provide an aggregated bandwidth for data streams 900A and 900N, which may be received from or transmitted to one or more mobile devices 912. Any number of carrier data streams 90Q may be aggregated combined in such fashion for uplink operations to, or downlink operations from, mobile devices 912.

Optional correlation circuitry 904A-904N (e.g., RX correlator and/or TX correlator shown in FIG. 5) may also be coupled to coupling circuitry 906A-906N. For example, as shown in FIG. 9, optional correlation circuitry 904A may be coupled to coupling circuitry 906A, and optional correlation circuitry 904N may be coupled to coupling circuitry 906N. For example, transmitter correlation circuitry may be configured to spread, based on the respective analog oscillation signals, one or more transmit signals across multiple channels within a respective wireless channel range 908A-908N to create transmit signals. Receiver correlation circuitry may be configured to de-spread one or more data signals received via the respective wireless communication channels.

Data streams 900 may comprise carrier data streams that are each received or transmitted via respective radio frequency channels within channel ranges 908A-908N. In certain non-limiting examples, data streams 900 comprise Long-Term Evolution (LTE) data streams, where each respective wireless channel range 908A and 908N comprises a 20 MHz channel range. When five such ranges are used, aggregated data pipes 910 may provide an aggregated bandwidth of 100 MHz. For example, coupling circuitry 906A may couple oscillation signals output by digital oscillator 902A with carrier data stream 900A that is transmitted or received via radio channel range 908A. Coupling circuitry 906B may couple oscillation signals output by digital oscillator 902B with carrier data stream 900B that is transmitted or received via radio channel range 908B. Coupling circuitry 906C may couple oscillation signals output by digital oscillator 902C with carrier data stream 900C that is transmitted or received via radio channel range 908C. Coupling circuitry 906D may couple oscillation signals output by digital oscillator 902D with carrier data stream 900D that is transmitted or received via radio channel range 908D. Coupling circuitry 906E may couple oscillation signals output by digital oscillator 902E with carrier data stream 900E that is transmitted or received via radio channel range 908E. In this case, where each respective radio channel range 908A, 908B, 908C, 908D, and 908E comprises a 20 MHz channel range, aggregated data pipes 910 may provide an aggregated, combined bandwidth of 100 MHz for uplink and/or downlink operations for mobile devices 912.

In some examples, the digital oscillation circuitry of each digital oscillator 902A-902N is associated with a transfer function $z^{-2} + r_2 z^1 + 1 = 0$, wherein $r_2$ represents the respective programmable code of the digital oscillator, and wherein $z^{-1}$ and $z^{-2}$ represent respective Z transforms. In some examples, the digital oscillation circuitry of each digital oscillator 902A-902N provides the respective digital oscillation signals at the respective one or more frequencies that are centered around fs/4 based on the respective programmable code of the digital oscillator, where fs is a sampling clock frequency for the respective digital oscillation circuitry. In various examples, the output frequency of the digital oscillator can range anywhere between 0 to fs/2, as a function of the programmable code. In some examples, each digital oscillator 902A-902N further includes an injection-locked oscillator communicatively coupled to the respective DAC of the digital oscillator, where the injection-locked oscillator functions as a bandpass filter with respect to the respective analog oscillation signals.

FIG. 10 is a block diagram illustrating an example computing system 1000, such as system that may be communicatively coupled to digital oscillator 100, in accordance with one or more aspects of the present disclosure. FIG. 10 illustrates only one particular example of computing system 1000, and many other examples of computing system 1000 may be used in other instances and may include a subset of the components shown, or may include additional components not shown, in FIG. 10. In some examples, computing system 1000 may comprise or be included in a mobile computing system or device (e.g., one or more of mobile devices 912).

As shown in the example of FIG. 10, computing system 1000 includes one or more processing units 1002, one or more input devices 1006, one or more communication units 1004, one or more output devices 1008, and one or more storage devices 1012. Communication channels 1010 may interconnect each of the components 1002, 1004, 1006, 1008, 1012 for inter-component communications (physically, communicatively, and/or operatively). In some examples, communication channels 1010 may include a system bus, a network connection, an inter-process communication data structure, or any other method for communicating data between hardware and/or software.

One or more input devices 1006 of computing system 1000 may receive input. Examples of input are tactile, audio, and video input. Examples of input devices 1006 include a presence-sensitive screen, touch-sensitive screen, mouse, keyboard, voice responsive system, video camera, microphone or any other type of device for detecting input from a human or machine. One or more output devices 1008 of computing system 1000 may generate output.

Examples of output are tactile, audio, and video output. Examples of output devices 1008 include a presence-sensitive screen, sound card, video graphics adapter card, speaker, cathode ray tube (CRT) monitor, liquid crystal display (LCD), or any other type of device for generating output to a human or machine. Output devices 1008 may include display devices such as cathode ray tube (CRT) monitor, liquid crystal display (LCD), or any other type of device for generating tactile, audio, and/or visual output.

One or more communication units 1004 of computing system 1000 may communicate with one or more other computing systems or devices via one or more networks by transmitting and/or receiving network signals on the one or more networks. Examples of communication units 1004 include a network interface card (e.g. such as an Ethernet card), an optical transceiver, a radio frequency transceiver, or any other type of device that can send and/or receive information, such as through a wired or wireless network. Other examples of communication units 1004 may include short wave radios, cellular data radios, wireless Ethernet network radios, as well as universal serial bus (USB) controllers. Communication units 1004 may include or be included in one or more of the receivers, transmitters, transceivers, oscillators, correlators, and/or other circuitry described herein and illustrated in one or more of the previous figures.

One or more storage devices 1012 within computing system 1000 may store information for processing during operation of computing system 1000 (e.g., computing system 1000 may store data accessed by one or more modules, processes, applications, or the like during execution at computing system 1000). In some examples, storage devices 1012 on computing system 1000 may be configured for short-term storage of information as volatile memory and therefore not retain stored contents if powered off. Examples of volatile memories include random access memories (RAM), dynamic random access memories. (DRAM), static random access memories (SRAM), and other forms of volatile memories known in the art. In some cases, storage devices 1012 may include redundant array of independent disks (RAID) configurations and one or more solid-state drives (SSD's).

Storage devices 1012, in some examples, also include one or more computer-readable storage media. Storage devices 1012 may be configured to store larger amounts of information than volatile memory. Storage devices 1012 may further be configured for long-term storage of information as non-volatile memory space and retain information after power on/off cycles. Examples of non-volatile memories include magnetic hard discs, optical discs, floppy discs, flash memories, or forms of electrically programmable memories (EPROM) or electrically erasable and programmable (EEPROM) memories. Storage devices 1012 may store program instructions and/or data associated with one or more software/firmware elements or modules.

Computing system 1000 further includes one or more processing units 1002 that may implement functionality and/or execute instructions within computing system 1000. For example, processing units 1002 may receive and execute instructions stored by storage devices 1012 that execute the functionality of the elements and/or modules described herein. These instructions executed by processing units 1002 may cause computing system 1000 to store information within storage devices 1012 during program execution. Processing units 1002 may also comprise circuitry to implement one or more of the receivers, transmitters, transceivers, oscillators, correlators, and/or other circuitry described herein and illustrated in one or more of the previous figures.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise random-access memory (RAM), read-only memory (ROM), electrically erasable programmable read-only memory (EEPROM), compact disc read-only memory (CD-ROM), or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc, laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSP's), general purpose microprocessors, application specific integrated circuits (ASIC's), field programmable logic arrays (FPGA's), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of IC's (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. Any combination of the described systems, operations, or functions is contemplated. These and other examples are within the scope of the following claims.

The invention claimed is:

1. A programmable digital oscillator, comprising:
digital oscillation circuitry that includes exactly one digital multiplier, exactly one digital adder, and exactly two registers,
wherein the digital oscillation circuitry is configured to provide digital oscillation signals at one or more frequencies as a function of a programmable code,
wherein the programmable code is provided as input to the exactly one digital multiplier,
wherein the programmable code comprises a programmable hopping code, and
wherein the digital oscillation circuitry is configured to provide the digital oscillation signals at the one or more frequencies as a function of the programmable hopping code; and
a digital-to-analog converter (DAC) communicatively coupled to the digital oscillation circuitry, wherein the DAC is configured to convert the digital oscillation signals from the digital oscillation circuitry into analog oscillation signals.

2. The programmable digital oscillator of claim 1, wherein the one digital multiplier includes a quantization noise source.

3. The programmable digital oscillator of claim 1, wherein:
the exactly two registers include a first register and a second register,
the first register is electrically coupled to the second register,
the exactly one digital multiplier is electrically coupled to the exactly one digital adder and to the each of the first and second registers, and
the exactly one digital adder is electrically coupled to the exactly one digital multiplier and to each of the first and second registers.

4. The programmable digital oscillator of claim 1, wherein the digital oscillation circuitry provides the digital oscillation signals at the one or more frequencies in a range from 0 to fs/2 based on the programmable code, where fs is a sampling clock frequency for the digital oscillation circuitry.

5. The programmable digital oscillator of claim 1, further comprising:

an injection-locked oscillator communicatively coupled to the DAC, wherein the injection-locked oscillator functions as a bandpass filter with respect to the analog oscillation signals.

6. The programmable digital oscillator of claim 1, wherein the digital oscillation circuitry is associated with a transfer function $z^{-2}+r_2z^{-1}+1=0$, wherein $r_2$ represents the programmable code, and wherein $z^{-1}$ and $z^{-2}$ represent respective Z transforms.

7. A digital oscillator system, comprising:
a plurality of digital oscillators including a first digital oscillator and a second digital oscillator, wherein each digital oscillator of the plurality of digital oscillators comprises:
   digital oscillation circuitry that includes exactly one digital multiplier, exactly one digital adder, and exactly two registers, wherein the digital oscillation circuitry is configured to provide digital oscillation signals at one or more frequencies as a function of a programmable code of the respective digital oscillator, and wherein the programmable code is provided as input to the exactly one digital multiplier; and
   a digital-to-analog converter (DAC) communicatively coupled to the digital oscillation circuitry, wherein the DAC is configured to convert the digital oscillation signals from the digital oscillation circuitry into analog oscillation signals,
   wherein the first digital oscillator is configured to output first analog oscillation signals of the analog oscillation signals, and
   wherein the second digital oscillator is configured to output second analog oscillation signals of the analog oscillation signals; and
coupling circuitry that is configured to communicatively couple the first analog oscillation signals with a first carrier data stream that is received or transmitted via wireless communication channels within a first wireless channel range, and couple the second analog oscillation signals with a second carrier data stream that is received or transmitted via wireless communication channels within a second wireless channel range that is different from the first wireless channel range,
wherein the first and second carrier data streams are aggregated via one or more aggregated data pipes to provide an aggregated bandwidth for the first and second carrier data streams.

8. The digital oscillator system of claim 7, wherein the wireless communication channels comprises radio frequency channels.

9. The digital oscillator system of claim 7, wherein the first and second carrier data streams are output to one or more mobile devices.

10. The digital oscillator system of claim 7, wherein the first and second carrier data streams comprise Long-Term Evolution (LTE) data streams, wherein the first wireless channel range and the second wireless channel range comprises a 20 MHz channel range, and wherein the aggregated bandwidth comprises a 100 MHz aggregated bandwidth.

11. The programmable digital oscillator of claim 7, wherein for each digital oscillator of the plurality of digital oscillators:
   the exactly two registers include a first register and a second register,
   the first register is electrically coupled to the second register, the exactly one digital multiplier is electrically coupled to the exactly one digital adder and to the each of the first and second registers, and
   the exactly one digital adder is electrically coupled to the exactly one digital multiplier and to each of the first and second registers.

12. The digital oscillator system of claim 7,
   wherein the programmable code comprises a programmable hopping code,
   wherein each digital oscillator of the plurality of digital oscillators is further communicatively coupled to transmitter correlation circuitry that is configured to spread, based on the respective analog oscillation signals, one or more transmit signals across multiple channels within the respective wireless channel range to create frequency-hopped transmit signals; and
   wherein each digital oscillator of the plurality of digital oscillators is further communicatively coupled to receiver correlation circuitry that is configured to de-spread one or more frequency-hopped data signals received via the respective wireless communication channels.

13. The digital oscillator system of claim 7, wherein each digital oscillator of the plurality of digital oscillators further comprises an injection-locked oscillator communicatively coupled to the respective DAC, wherein the injection-locked oscillator functions as a bandpass filter with respect to the respective analog oscillation signals.

14. A method of carrier aggregation, comprising:
providing, by a first digital oscillator included in a plurality of digital oscillators, first analog oscillation signals;
providing, by a second digital oscillator included in the plurality of digital oscillators, second analog oscillation signals, wherein each of the first and second digital oscillators comprises:
   digital oscillation circuitry that includes exactly one digital multiplier, exactly one digital adder, and exactly two registers, wherein the digital oscillation circuitry is configured to provide respective digital oscillation signals at one or more frequencies as a function of a programmable code of the respective digital oscillator, and wherein the programmable code is provided as input to the exactly one digital multiplier; and
   a digital-to-analog converter (DAC) communicatively coupled to the digital oscillation circuitry, wherein the DAC is configured to convert the respective digital oscillation signals from the digital oscillation circuitry into respective analog oscillation signals;
coupling, by coupling circuitry, the first analog oscillation signals with a first carrier data stream that is received or transmitted via wireless communication channels within a first wireless channel range; and
coupling, by the coupling circuitry, the second analog oscillation signals with a second carrier data stream that is received or transmitted via wireless communication channels within a second wireless channel range that is different from the first wireless channel range,
wherein the first and second carrier data streams are aggregated via one or more aggregated data pipes to provide an aggregated bandwidth for the first and second carrier data streams.

15. The method of claim 14, wherein the first and second carrier data streams comprise first and second Long-Term Evolution (LTE) data streams, wherein the first and second wireless channel ranges each comprises a 20 MHz channel range.

16. The method of claim 15, further comprising:

coupling, by the coupling circuitry, third analog oscillation signals provided by third digital oscillator with a third carrier data stream that is received or transmitted via wireless communication channels within a third wireless channel range;

coupling, by the coupling circuitry, fourth analog oscillation signals provided by fourth digital oscillator with a fourth carrier data stream that is received or transmitted via wireless communication channels within a fourth wireless channel range;

coupling, by the coupling circuitry, fifth analog oscillation signals provided by fifth digital oscillator with a fifth carrier data stream that is received or transmitted via wireless communication channels within a fifth wireless channel range, wherein the third, fourth, and fifth wireless channel ranges each comprises a 20 MHz channel range, and wherein the first, second, third, fourth, and fifth carrier data streams are aggregated via the one or more aggregated data pipes to provide the aggregated bandwidth of 100 MHz.

17. The method of claim 14, wherein for each of the first and second digital oscillators:

the exactly two registers include a first register and a second register, the first register is electrically coupled to the second register, the exactly one digital multiplier is electrically coupled to the exactly one digital adder and to the each of the first and second registers, and the exactly one digital adder is electrically coupled to the exactly one digital multiplier and to each of the first and second registers.

18. A programmable digital oscillator, comprising:

digital oscillation circuitry that includes exactly one digital multiplier, exactly one digital adder, and exactly two registers, wherein the digital oscillation circuitry is configured to provide digital oscillation signals at one or more frequencies as a function of a programmable code, wherein the programmable code is provided as input to the exactly one digital multiplier, wherein the programmable code comprises a programmable, continuously changing ramp code, and wherein the digital oscillation circuitry is configured to provide the digital oscillation signals at the one or more frequencies as a function of the programmable, continuously changing ramp code; and a digital-to-analog converter (DAC) communicatively coupled to the digital oscillation circuitry, wherein the DAC is configured to convert the digital oscillation signals from the digital oscillation circuitry into analog oscillation signals.

19. The programmable digital oscillator of claim 18, wherein the one digital multiplier includes a quantization noise source.

20. The programmable digital oscillator of claim 18, wherein:

the exactly two registers include a first register and a second register, the first register is electrically coupled to the second register, the exactly one digital multiplier is electrically coupled to the exactly one digital adder and to the each of the first and second registers, and the exactly one digital adder is electrically coupled to the exactly one digital multiplier and to each of the first and second registers.

21. The programmable digital oscillator of claim 18, wherein the digital oscillation circuitry provides the digital oscillation signals at the one or more frequencies in a range from 0 to fs/2 based on the programmable code, where fs is a sampling clock frequency for the digital oscillation circuitry.

22. The programmable digital oscillator of claim 18, further comprising:

an injection-locked oscillator communicatively coupled to the DAC, wherein the injection-locked oscillator functions as a bandpass filter with respect to the analog oscillation signals.

* * * * *